US012113120B2

United States Patent
Hsiao et al.

(10) Patent No.: US 12,113,120 B2
(45) Date of Patent: Oct. 8, 2024

(54) GATE ELECTRODE HAVING A WORK-FUNCTION LAYER INCLUDING MATERIALS WITH DIFFERENT AVERAGE GRAIN SIZES

(71) Applicant: Taiwan Semiconductor Manufacturing Co., Ltd., Hsinchu (TW)

(72) Inventors: Ru-Shang Hsiao, Jhubei (TW); Ching-Hwanq Su, Tainan (TW); Pin Chia Su, Shanhua Township (TW); Ying Hsin Lu, Tainan (TW); Ling-Sung Wang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 73 days.

(21) Appl. No.: 17/813,814

(22) Filed: Jul. 20, 2022

(65) Prior Publication Data
US 2022/0359728 A1    Nov. 10, 2022

Related U.S. Application Data

(62) Division of application No. 16/882,014, filed on May 22, 2020, now Pat. No. 11,502,185.
(Continued)

(51) Int. Cl.
*H01L 29/08*    (2006.01)
*H01L 21/28*    (2006.01)
(Continued)

(52) U.S. Cl.
CPC .. *H01L 29/66795* (2013.01); *H01L 21/28088* (2013.01); *H01L 21/76877* (2013.01);
(Continued)

(58) Field of Classification Search
CPC . H01L 21/28026–28105; H01L 29/495–4958; H01L 29/4966;
(Continued)

(56) References Cited

U.S. PATENT DOCUMENTS

| 6,139,951 | A  | 10/2000 | Chen et al.   |
| 6,242,349 | B1 | 6/2001  | Nogami et al. |

(Continued)

FOREIGN PATENT DOCUMENTS

| CN | 103681892 A | 3/2014 |
| CN | 108573871 A | 9/2018 |

(Continued)

OTHER PUBLICATIONS

Electron Work Function of the Elements (Year: 1979).*

*Primary Examiner* — Younes Boulghassoul
(74) *Attorney, Agent, or Firm* — Slater Matsil, LLP

(57) ABSTRACT

A method includes forming a dummy gate stack over a semiconductor region, removing the dummy gate stack to form a trench between gate spacers, forming a replacement gate dielectric extending into the trench, and forming a replacement gate electrode on the replacement gate dielectric. The forming the replacement gate electrode includes depositing a metal-containing layer. The depositing the metal-containing layer includes depositing a lower layer having a first average grain size, and depositing an upper layer over the lower layer. The lower layer and the upper layer are formed of a same material, and the upper layer has a second average grain size greater than the first average grain size. Source and drain regions are formed on opposing sides of the replacement gate electrode.

20 Claims, 22 Drawing Sheets

Related U.S. Application Data

(60) Provisional application No. 62/940,406, filed on Nov. 26, 2019.

(51) Int. Cl.
*H01L 21/768* (2006.01)
*H01L 21/8234* (2006.01)
*H01L 29/49* (2006.01)
*H01L 29/66* (2006.01)
*H01L 29/78* (2006.01)
*H01L 21/762* (2006.01)

(52) U.S. Cl.
CPC .... H01L 21/82345 (2013.01); H01L 29/0847 (2013.01); H01L 29/4966 (2013.01); H01L 29/66545 (2013.01); H01L 29/785 (2013.01); H01L 29/7851 (2013.01); *H01L 21/76224* (2013.01); *H01L 21/823418* (2013.01); *H01L 21/823431* (2013.01); *H01L 21/823437* (2013.01); *H01L 21/823481* (2013.01)

(58) Field of Classification Search
CPC ............. H01L 29/4975; H01L 29/4983; H01L 21/823437; H01L 21/82345; H01L 21/823456; H01L 21/823828; H01L 21/823842; H01L 21/82385; H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/66545; H01L 21/28079; H01L 21/28088; H01L 21/28097
See application file for complete search history.

(56) References Cited

U.S. PATENT DOCUMENTS

| | | | |
|---|---|---|---|
| 6,429,523 | B1 | 8/2002 | Andricacos et al. |
| 6,737,716 | B1 | 5/2004 | Matuso et al. |
| 9,425,279 | B1 | 8/2016 | Ando et al. |
| 9,935,173 | B1* | 4/2018 | Wu ................. H01L 21/823437 |
| 10,790,196 | B2 | 9/2020 | Cheng et al. |
| 10,825,727 | B2 | 11/2020 | Tsai et al. |
| 2008/0122007 | A1 | 5/2008 | Kawai et al. |
| 2014/0076392 | A1 | 3/2014 | Lin et al. |
| 2014/0183745 | A1 | 7/2014 | Yu et al. |
| 2015/0228543 | A1* | 8/2015 | Yu ................... H01L 21/823456 438/665 |
| 2018/0315652 | A1 | 11/2018 | Tsai et al. |
| 2018/0337053 | A1* | 11/2018 | Huang ................ H01L 29/4983 |
| 2018/0342518 | A1* | 11/2018 | Kim ................. H01L 21/76224 |
| 2019/0103311 | A1 | 4/2019 | Tsai et al. |
| 2019/0259855 | A1* | 8/2019 | Cheng ............... H01L 21/28518 |
| 2019/0385855 | A1* | 12/2019 | Chien ............... H01L 29/66795 |

FOREIGN PATENT DOCUMENTS

| | | |
|---|---|---|
| KR | 20090042416 A | 4/2009 |
| KR | 20180121314 A | 11/2018 |
| KR | 20190053068 A | 5/2019 |

* cited by examiner

GATE ELECTRODE HAVING A WORK-FUNCTION LAYER INCLUDING MATERIALS WITH DIFFERENT AVERAGE GRAIN SIZES

PRIORITY CLAIM AND CROSS-REFERENCE

This application is a divisional of U.S. patent application Ser. No. 16/882,014, entitled "P-Type FiNFET as an Radio-Frequency Device and Method Forming Same," and filed May 22, 2020, which claims the benefit of the U.S. Patent Application No. 62/940,406, entitled "Novel P-FinFET RF Device," and filed Nov. 26, 2019, which applications are hereby incorporated herein by reference.

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be generated at the surface of the semiconductor.

Metal gates may include a plurality of layers, so that the different requirements of NMOS devices and PMOS devices can be met. The formation of metal gates typically involves removing dummy gate stacks to form trenches, depositing a plurality of metal layers extending into the trenches, forming metal regions to fill the remaining portions of the trenches, and then performing a Chemical Mechanical Polish (CMP) process to remove excess portions of the metal layers. The remaining portions of the metal layers and metal regions form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
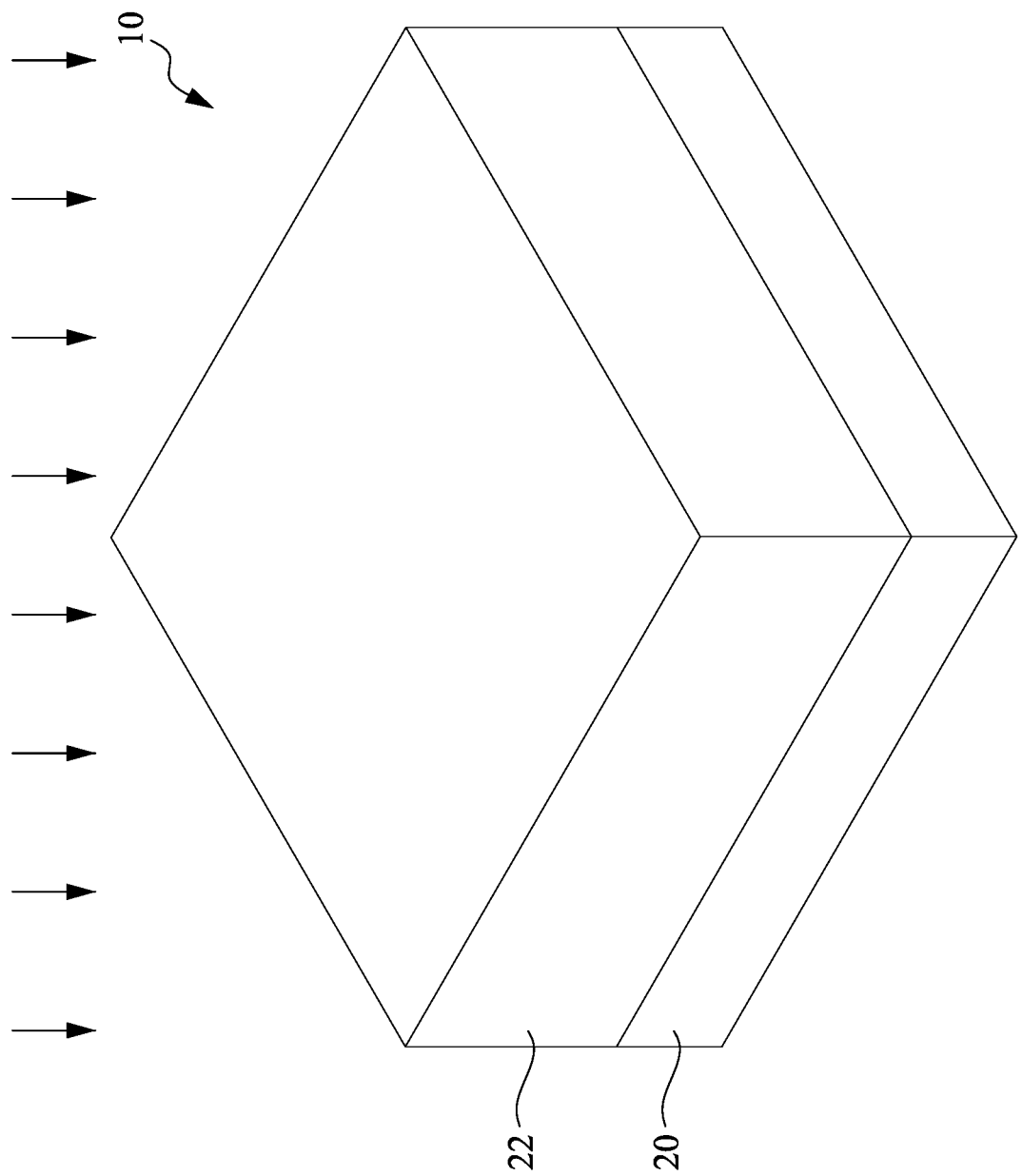
FIGS. 1-6, 7A, 7B, 8A, 8B, 9-13, 14A, and 14B illustrate the perspective views and cross-sectional views of intermediate stages in the formation of p-type Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A p-type transistor suitable for being used as a Radio-Frequency (RF) device and the formation methods are provided. In accordance with some embodiments of the present disclosure, a metal (replacement) gate is formed for a p-type transistor, which is used as the RF device. The metal gate includes two metal-containing layers formed of a same material and having different grain sizes. In accordance with embodiments, the formation of a p-type Fin Field-Effect (FinFET) is used as an example to explain the concept of the present disclosure. Other types of transistors such as p-type planar transistors, p-type nano-sheet or nano wire transistors, p-type Gate-All-Around (GAA) transistors, or the like, may also adopt the concept of the present disclosure. The intermediate stages of forming the p-type FinFET are illustrated in accordance with some embodiments. Some variations of some embodiments are discussed. Throughout the various views and illustrative embodiments, like reference numbers are used to designate like elements. Although method embodiments may be discussed as being performed in a particular order, other method embodiments may be performed in any logical order.

Figure 22:
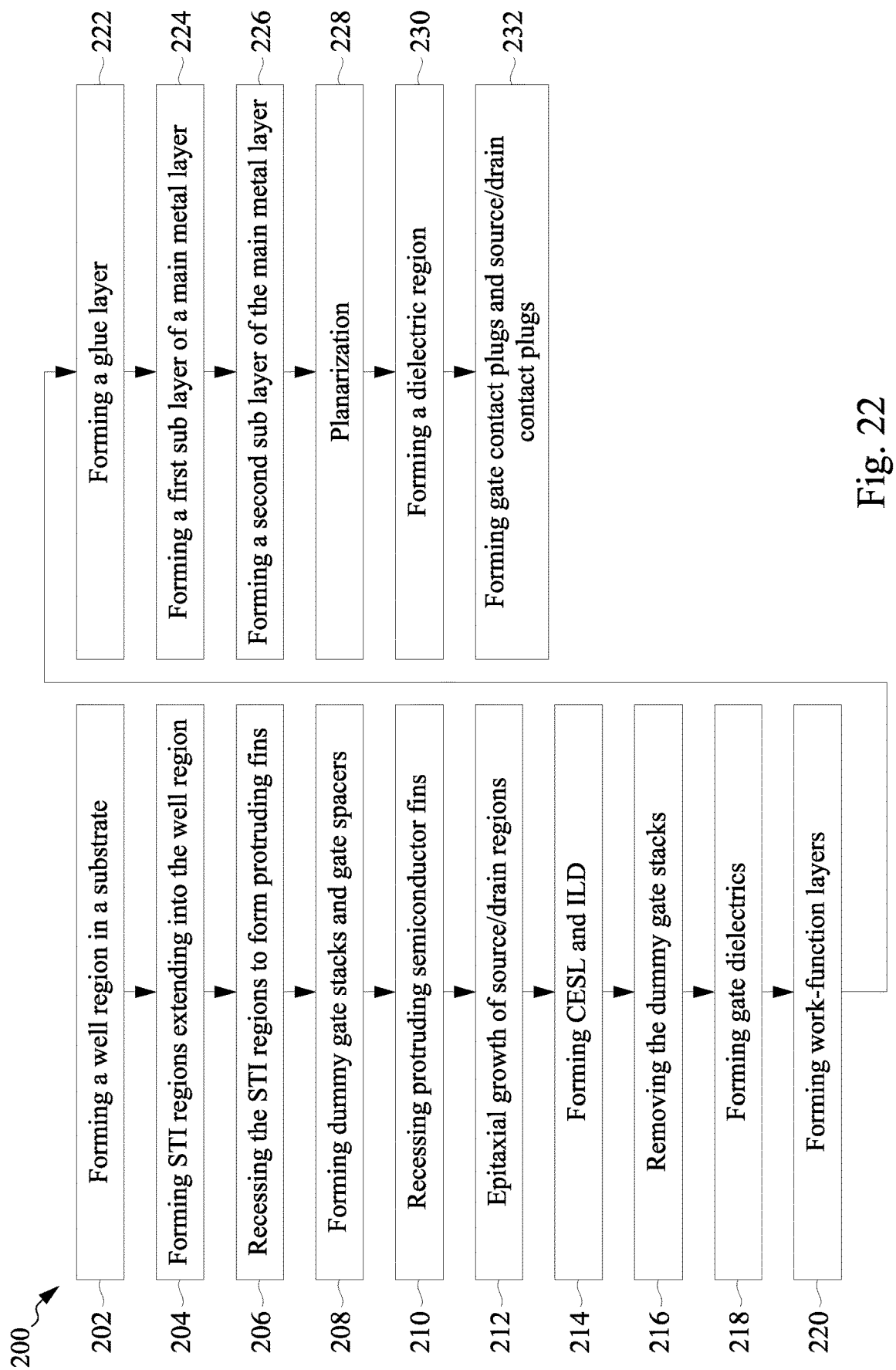
FIG. 22 illustrates a process flow for forming a p-type FinFET that can be used as an RF device in accordance with some embodiments.

FIGS. 1-6, 7A, 7B, 8A, 8B, 9-13, 14A, and 14B illustrate the cross-sectional views and perspective views of intermediate stages in the formation of FinFETs in accordance with some embodiments of the present disclosure. The processes shown in these figures are also reflected schematically in the process flow 200 shown in FIG. 22.

Referring to FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 22. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
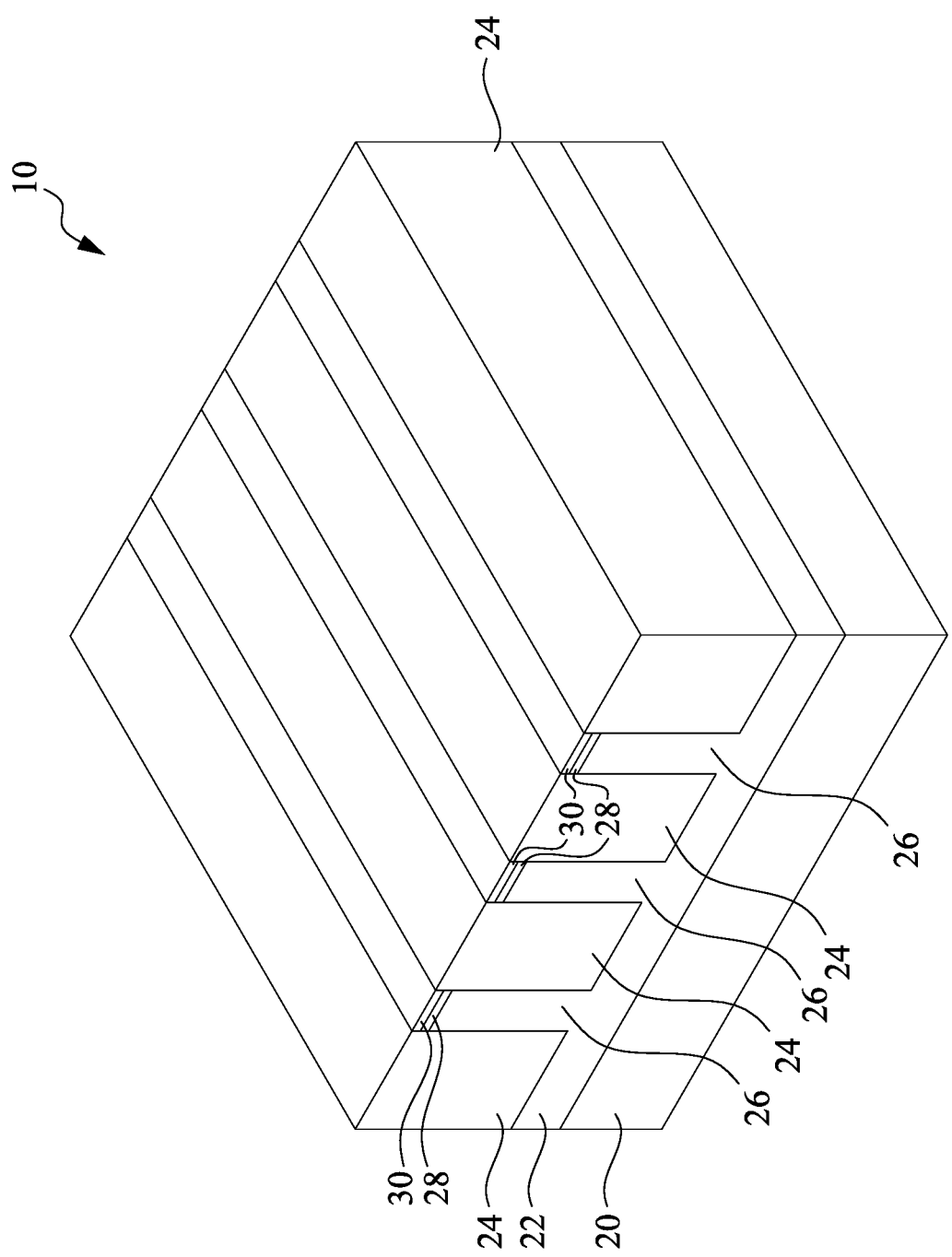

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 shown in FIG. 22. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material. Hard masks 30 are then removed.

Figure 3:
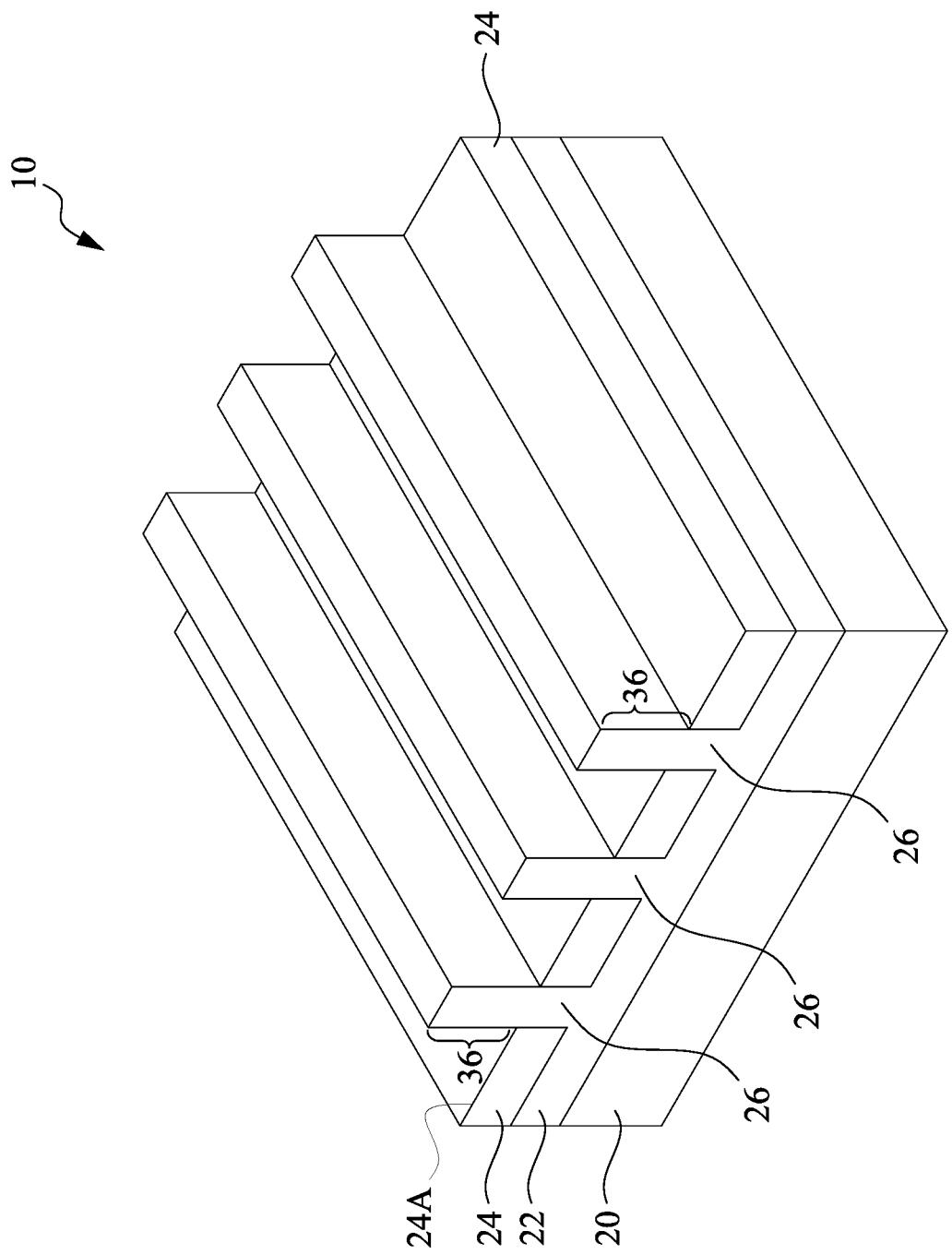

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 shown in FIG. 22. Pad oxides 28 are also removed. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
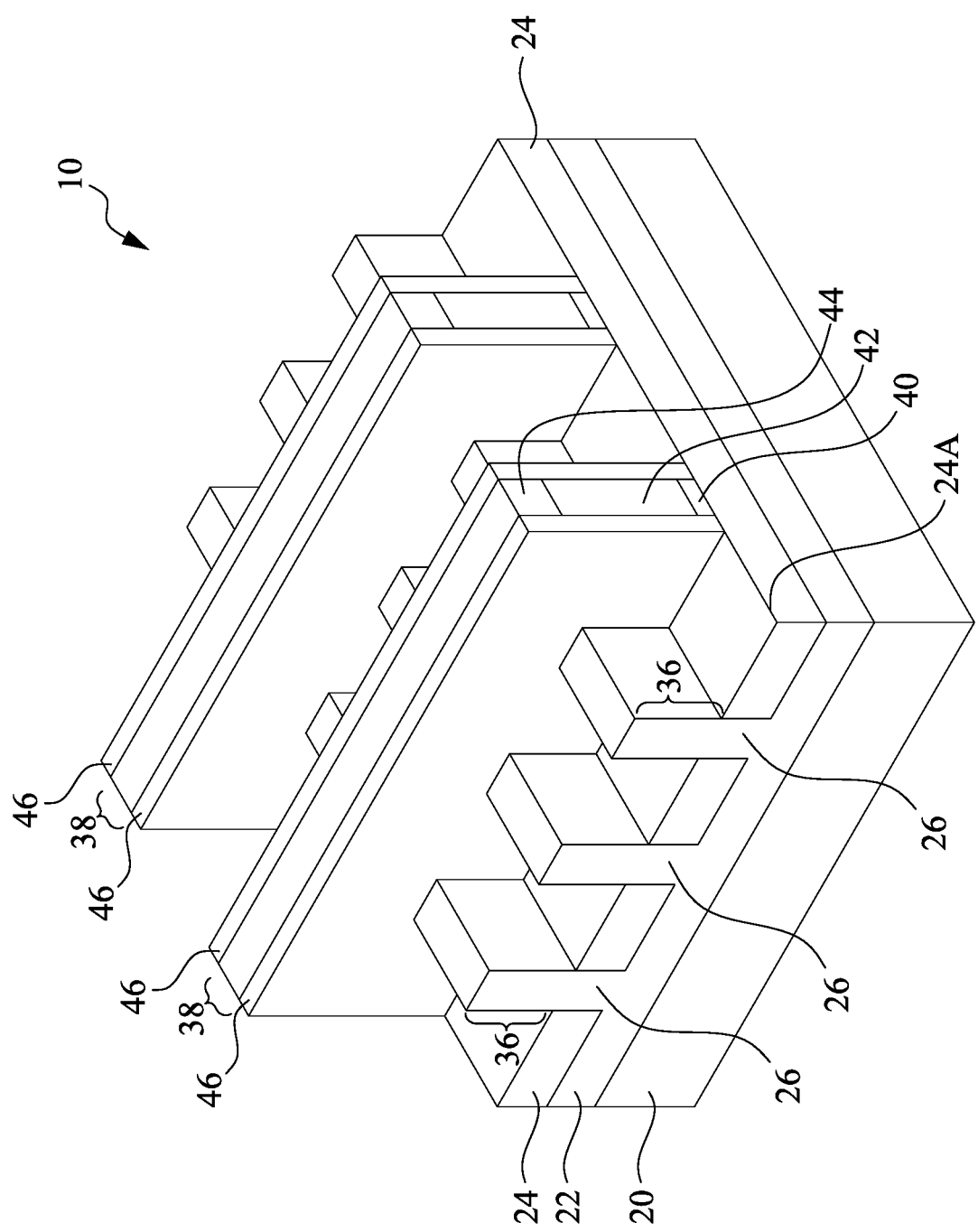

Referring to FIG. 4, dummy gate stacks 38 are formed to extend on the top surfaces and the sidewalls of (protruding) fins 36. The respective process is illustrated as process 208 in the process flow 200 shown in FIG. 22. Dummy gate stacks 38 may include dummy gate dielectrics 40 and dummy gate electrodes 42 over dummy gate dielectrics 40. Dummy gate dielectrics 40 may be formed of silicon oxide or like materials. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 shown in FIG. 22. In accordance with some embodiments of the present disclosure, gate spacers 46 are formed of a low-k dielectric material(s) such as porous silicon oxy-nitride, porous silicon carbo-nitride, porous silicon nitride, or the like, and may have a single-layer structure or a multi-layer structure including a plurality of dielectric layers. The dielectric constant (k value) of gate spacers 46 is lower than 3.8, and may be lower than about 3.0, for example, in the range between about 2.5 and about 3.0.

Figure 5:
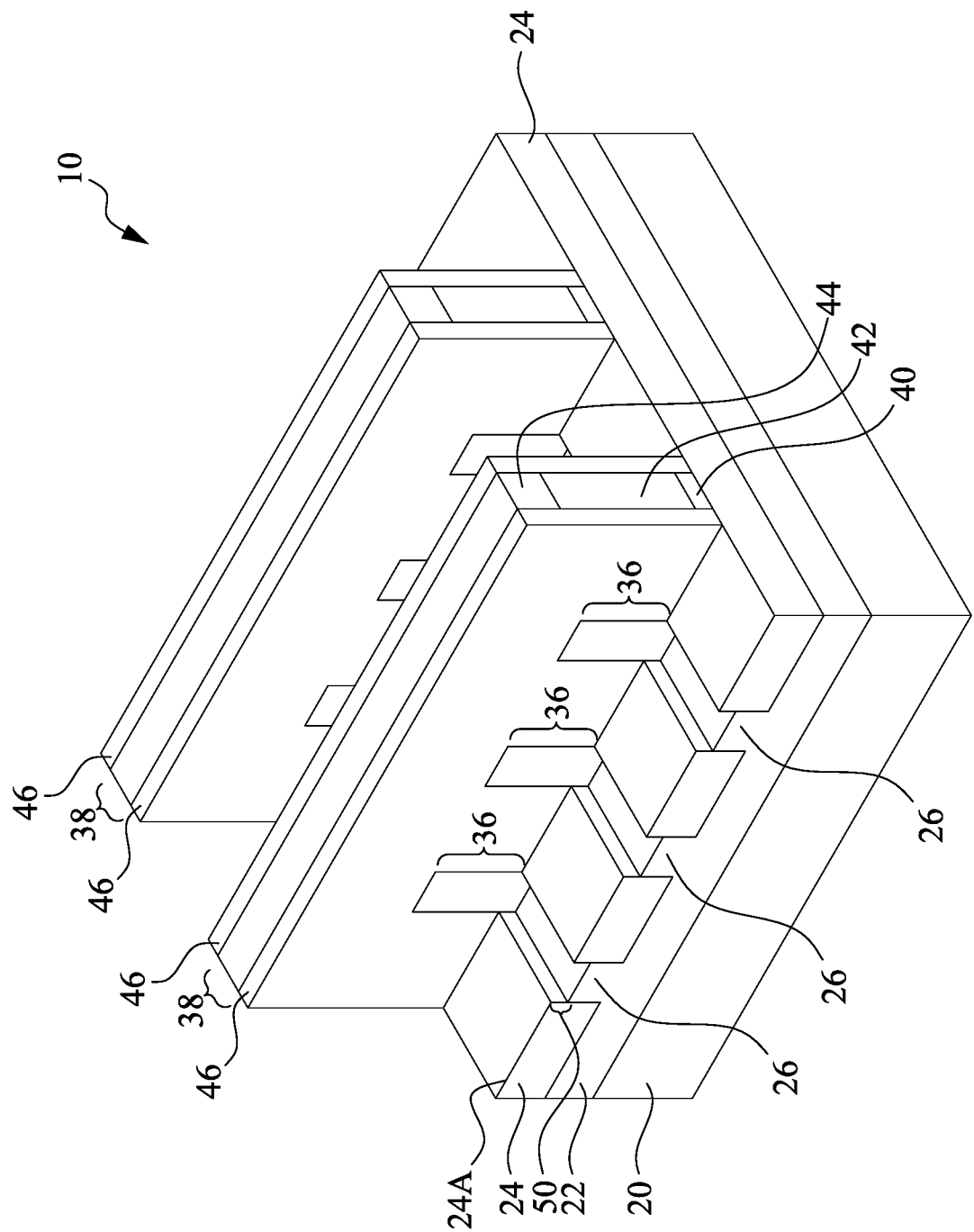

An etching process is then performed to etch the portions of protruding fins 36 that are not covered by dummy gate stacks 38 and gate spacers 46, resulting in the structure shown in FIG. 5. The respective process is illustrated as process 210 in the process flow 200 shown in FIG. 22. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
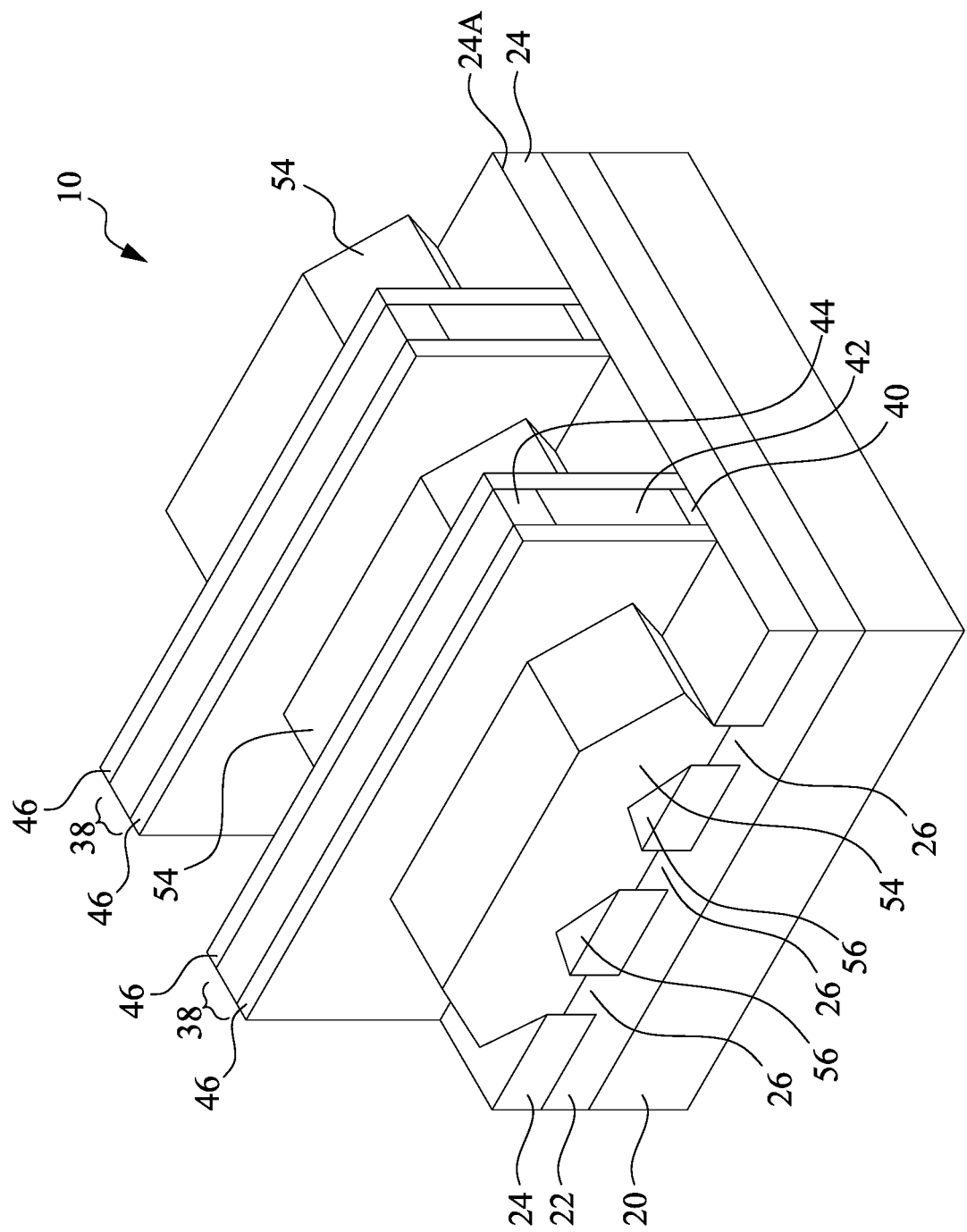

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 shown in FIG. 22. For example, when the resulting FinFET is a p-type FinFET, boron doped silicon germanium (SiGeB), boron-doped silicon (SiB), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

After the epitaxy step, epitaxy regions 54 may be further implanted with a p-type impurity to form source and drain regions, which are also denoted using reference numeral 54. In accordance with alternative embodiments of the present disclosure, the implantation step is skipped when epitaxy regions 54 are in-situ doped with a p-type impurity during the epitaxy.

Figure 7A:
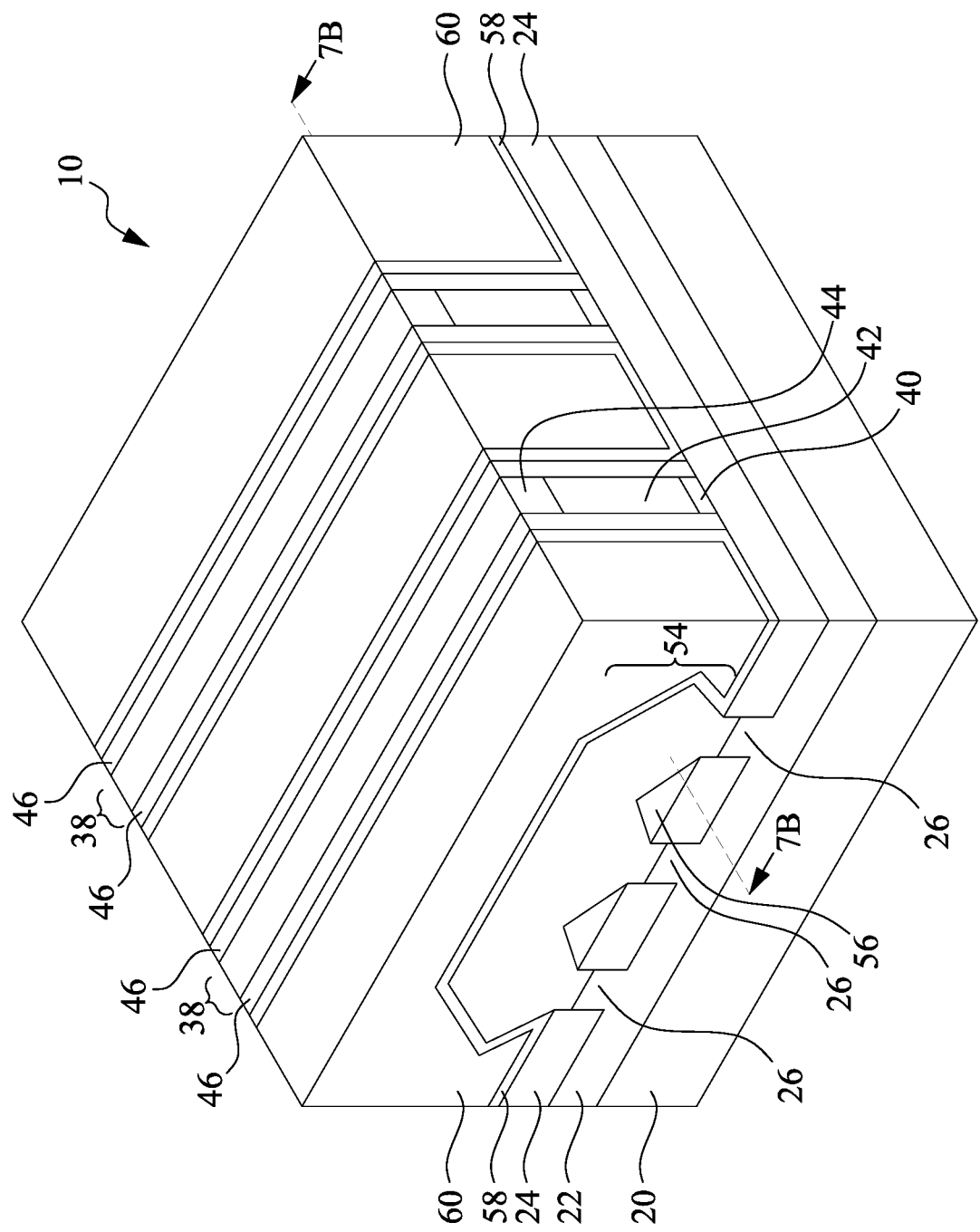
Figure 7B:
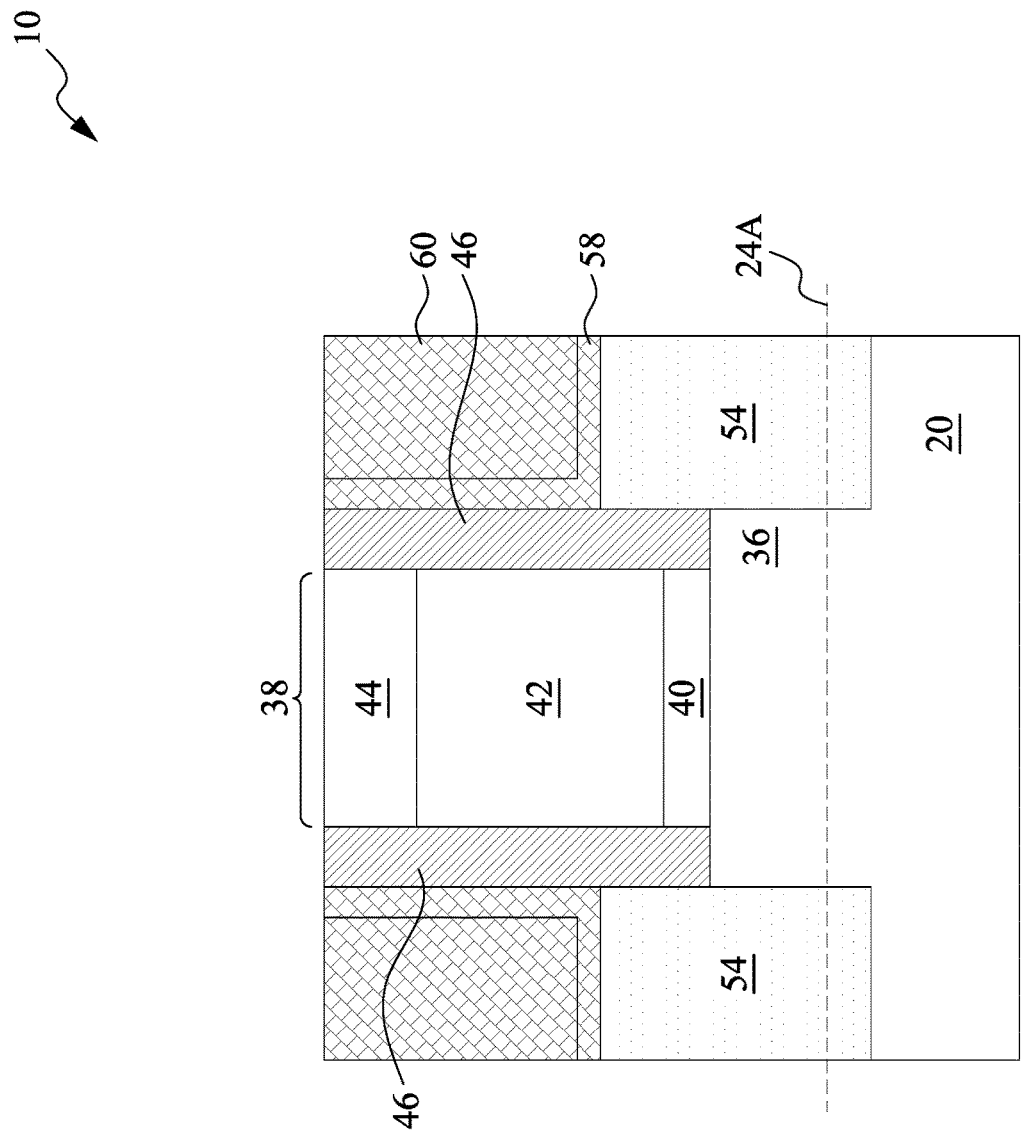

FIG. 7A illustrates a perspective view of the structure after the formation of Contact Etch Stop Layer (CESL) 58 and Inter-Layer Dielectric (ILD) 60. The respective process is illustrated as process 214 in the process flow 200 shown in FIG. 22. CESL 58 may be formed of silicon nitride, silicon oxide, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other. FIG. 7B illustrates a reference cross-section 7B-7B shown in FIG. 7A. In FIG. 7B and the subsequent cross-sectional views, the level of the top surface 24A of STI regions 24 is shown. and protruding fins 36 are higher than top surfaces 24A.

Figure 8A:
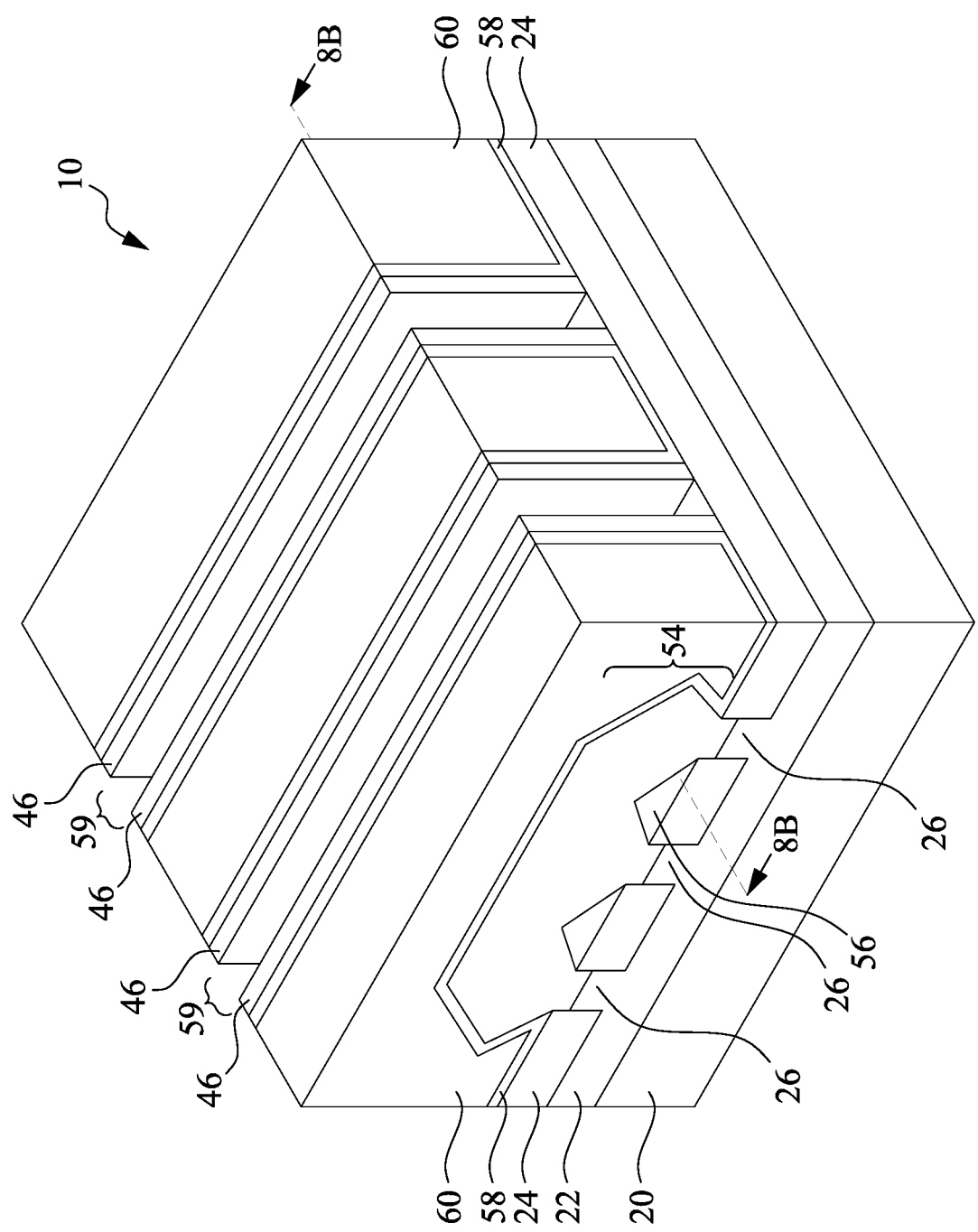
Figure 8B:
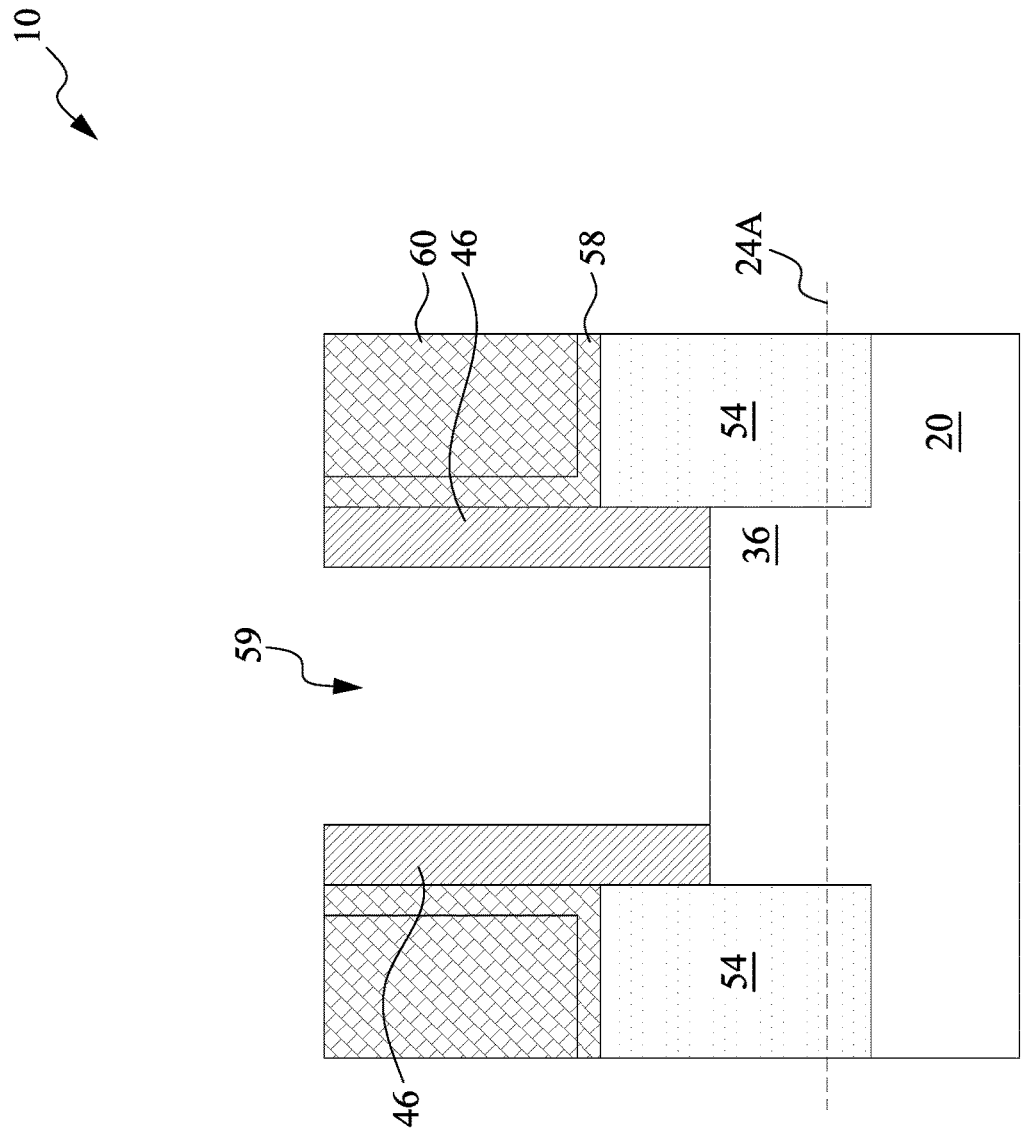

After the structure as shown in FIGS. 7A and 7B are formed, the dummy gate stack 38, which includes hard mask 44, dummy gate electrode 42, and dummy gate dielectric 40 as shown in FIGS. 7A and 7B are removed, forming openings 59 as shown in FIGS. 8A and 8B. FIG. 8B illustrates a reference cross-section 8B-8B shown in FIG. 8A. The respective process is illustrated as process 216 in the process flow 200 shown in FIG. 22. The top surfaces and the sidewalls of protruding fins 36 are exposed to openings 59.

Figure 9:
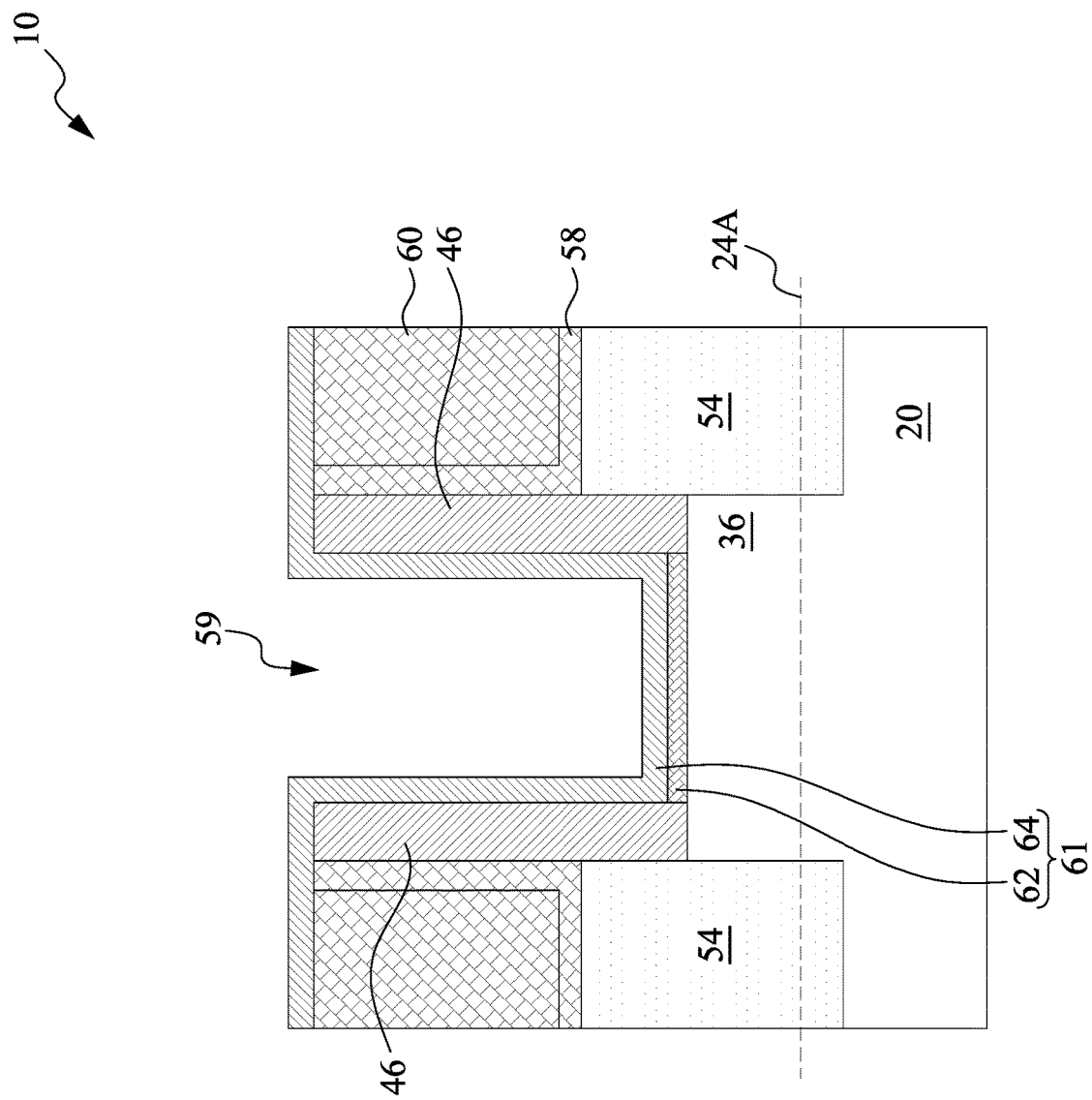

Next, referring to FIG. 9, gate dielectric 61 is formed, which extends into opening 59, and contacts the top surface and the sidewalls of protruding fin 36. The respective process is illustrated as process 218 in the process flow 200 shown in FIG. 22. In accordance with some embodiments of the present disclosure, gate dielectric 61 includes Interfacial Layer (IL) 62, which is formed on the exposed top and sidewall surfaces of protruding fin 36. IL 62 may include an oxide layer such as a silicon oxide layer, which is formed through the thermal oxidation of protruding fin 36, a chemical oxidation process, or a deposition process. Gate dielectric 61 may also include a high-k dielectric layer 64 over IL 62. High-k dielectric layer 64 may be formed of a high-k dielectric material comprising Si, Hf, Zr, Pb, Sb, La, or the like. For example, high-k dielectric layer 64 may be formed of or comprise hafnium oxide, lanthanum oxide, aluminum oxide, zirconium oxide, combinations thereof, multi-layers thereof, or the like. The thickness of high-k dielectric layer 64 may be in the range between about 10 Å and about 40 Å. The dielectric constant (k-value) of the high-k dielectric material is higher than 3.9, and may be higher than about 7.0, or higher. High-k dielectric layer 64 is overlying, and may contact, the respective underlying IL 62. High-k dielectric layer 64 is formed as a conformal layer, and extends on the sidewalls of protruding fin 36 and the top surface and the sidewalls of gate spacers 46. In accordance with some embodiments of the present disclosure, high-k dielectric layer 64 is formed using ALD, CVD, or the like.

Figure 10:
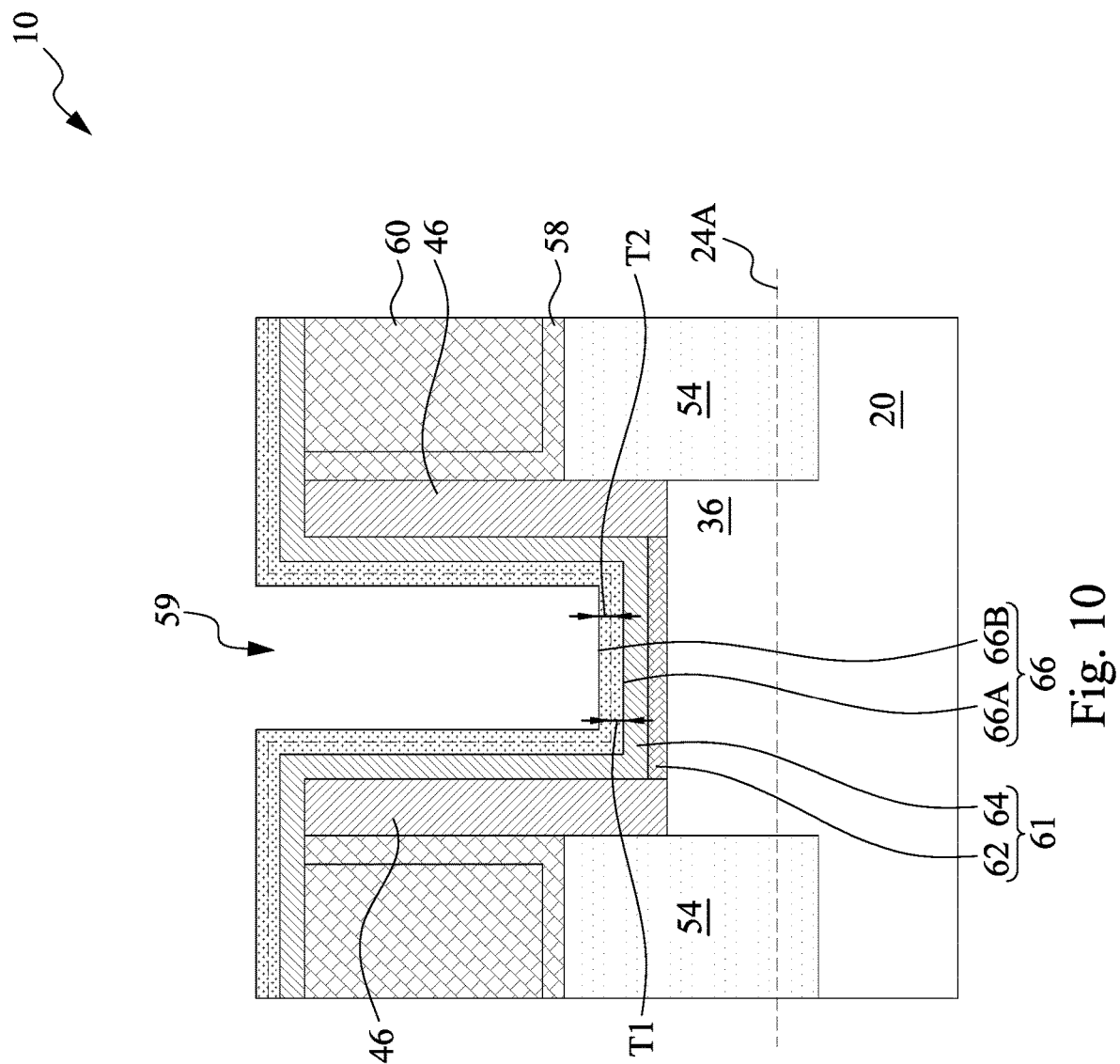

Further referring to FIG. 10, work-function layer 66 is formed through deposition. The respective process is illustrated as process 220 in the process flow 200 shown in FIG. 22. Work-function layer 66 may include a homogenous layer having an entirety formed of a same material, or may include a plurality of sub layers formed of materials different from each other. The work-function layer 66 includes a p-work-function layer having a work-function higher than about 4.5 eV. The work-function may be in the range between about 4.5 eV and about 5.3 eV. The work-function layer 66 may be a nitride or oxide of a metal(s) selected from Ti, Ta, Cr, Ni, Mo, Cu, Zr, Zn, Fe, Sn, or the like. For example, work-function layer 66 may be or comprise a TiN layer, a tungsten carbon nitride layer (WCN) layer, or a metal layer comprising tungsten, aluminum, cobalt, or alloys thereof, or the like.

In accordance with some embodiments, the work-function layer 66 includes a lower (sub) layer 66A and an upper (sub) layer 66B formed of the same material, and with the same composition or different compositions. Throughout the description, two layers are referred to as having the same composition when both of elements and the atomic percentages of the elements in these two layers are the same. Conversely, when two layers have different elements and/or different atomic percentages of the elements, the two layers are referred to as having different compositions. For example, when work-function layer 66 is formed of TiN, when both of the lower layer 66A and upper layer 66B are formed of TiN, lower layer 66A and upper layer 66B have the same composition when the atomic percentage of titanium in lower layer 66A is the same as the atomic percentage of titanium in upper layer 66B, and the atomic percentage of nitrogen in lower layer 66A is the same as the atomic percentage of nitrogen in upper layer 66B. In accordance with some embodiments, both of lower layer 66A and 66B have polycrystalline structures. In accordance with some embodiments, lower layer 66A and upper layer 66B are formed of the same element, and may have the same composition or different compositions. Lower layer 66A has grain sizes smaller than the grain sizes of upper layer 66B. The average grain size of lower layer 66A is smaller than about 5 nm, and the average grain size of upper layer 66B is in the range between about 3 nm and about 500 nm. The ratio of the average grain size of upper layer 66B to the average grain size of lower layer 66A is greater than 1.0, or may be greater than about 100, and may be in the range between about 1 and about 100.

Lower layer 66A and an upper layer 66B may be deposited through a conformal deposition method such as ALD, CVD, or the like. The difference in the grain sizes of lower layer 66A and an upper layer 66B may be achieved through adjusting the deposition process conditions including, and not limited to, the temperature of wafer 10, the flow rates of process gases and the pressure of the deposition chamber, the deposition rate, etc. For example, the lower layer 66A may be deposited at a higher temperature Temp1 in a range between about 300° C. and about 500° C., and the upper layer 66B may be deposited at a lower temperature Temp2 in a range between about 250° C. and about 450° C. The difference between the higher temperature Temp1 and the lower temperature Temp2 may be greater than about 50° C., and may be in the range between about 250° C. and about 500° C.

In accordance with some embodiments, lower layer 66A has gradient grain sizes, with upper portions of the lower layer 66A having increasingly greater grain sizes than the respective lower portions of the lower layer 66A. The gradient grain sizes may be achieved by gradually (in stages or continuously) adjusting the process conditions in the formation of lower layer 66A, for example, gradually reducing wafer temperature and/or gradually increase deposition rates, etc. Upper layer 66B, on the other hand, has a uniform grain size (with no distinguishable change in different sub layers of the upper layer 66B).

In accordance with some embodiments, same processes gases (precursors) are used in the formation of lower layer 66A and an upper layer 66B. Furthermore, the flow rate ratios of different process gases in the formation of lower layer 66A may be equal to, or different from, the corresponding flow rate ratios of the corresponding process gases in the formation of upper layer 66B. For example, when forming TiN using CVD, $TiCl_4$ and $NH_3$ may be used. The ratio of the flow rate of $TiCl_4$ to the flow rate of $NH_3$ in the formation of lower layer 66A may be equal to, or different from, the flow rate ratio of the flow rate of $TiCl_4$ to the flow rate of $NH_3$ in the formation of upper layer 66B.

By forming work-function layer 66 with two layers with the same material (having the same composition or different compositions), the lower layer 66A, with the smaller grain size, is suitable for acting as a seed layer for the formation of the upper layer 66B. The lower layer 66A, with the smaller grain size, however, has a relative high sheet resistance, which adversely affects the speed of the resulting transistor. Accordingly, the upper layer 66B is formed with larger grain and hence a lower sheet resistance to improve the performance. In accordance with some embodiments, the sheet resistance of the upper layer 66B to the sheet resistance of the lower layer 66A is smaller than 1.0, and may be in the range between about 0.2 and about 0.9.

In accordance with some embodiments, the thickness of work-function layer 66 may be in the range between about 10 Å and about 40 Å. To maximize the benefit of reducing the overall sheet resistance of work-function layer 66, upper layer 66B may be thicker than lower layer 66A. For example, the ratio of thickness T2 of upper layer 66B to the thickness T1 of lower layer 66A may be greater than 2, greater than 3, or the like. In other embodiments, thickness T2 may be equal to or smaller than thickness T1.

Figure 11:
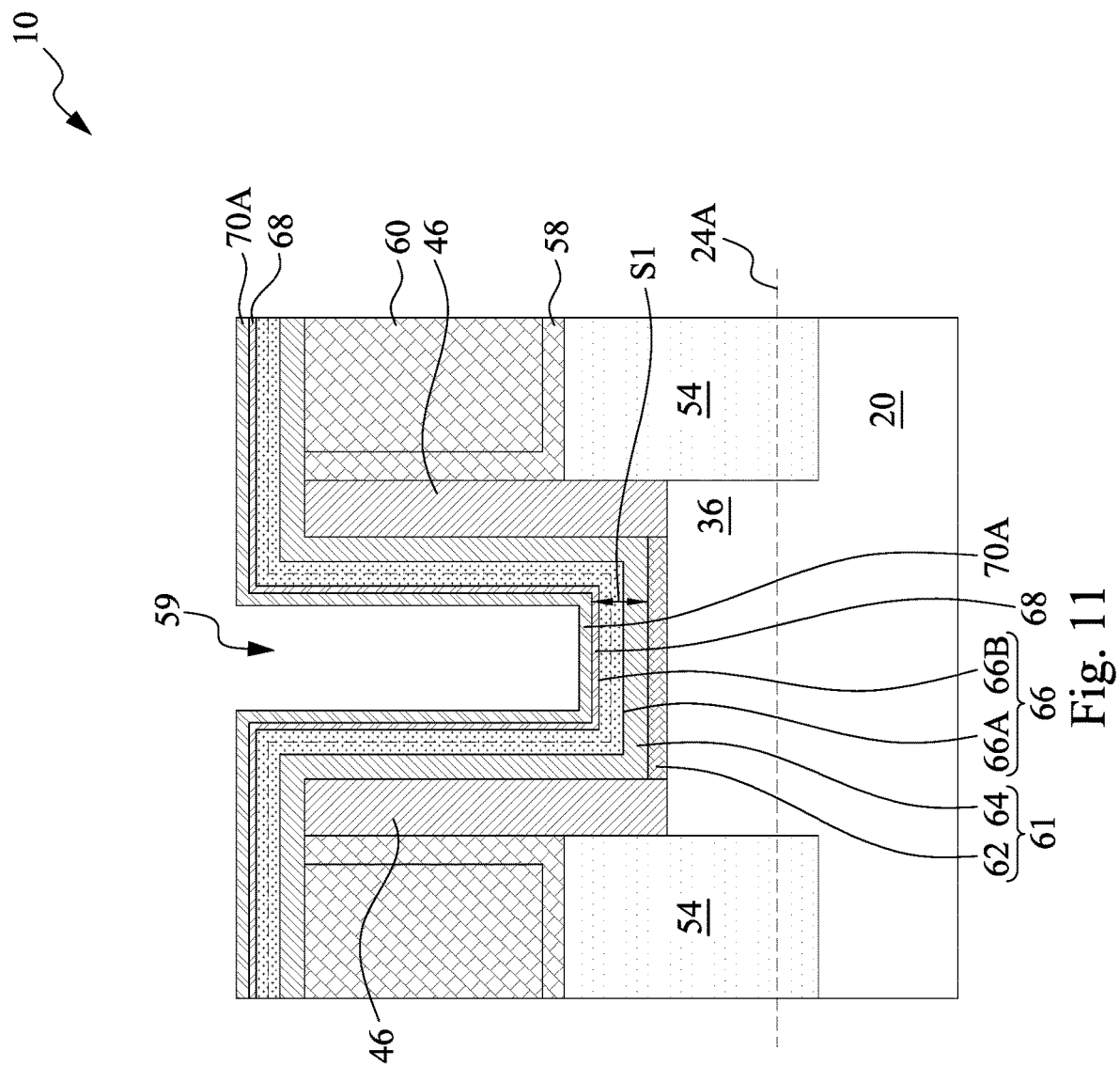

Referring to FIG. 11, glue layer (sometimes referred to as a blocking layer) 68 is formed. The respective process is also illustrated as process 222 in the process flow 200 shown in FIG. 22. Glue layer 68 may be a metal-containing layer, which may be formed of TiN, TaN, or the like in accordance with some embodiments. In accordance with some embodiments, glue layer 66 is formed using ALD, CVD, or the like.

Figure 12:
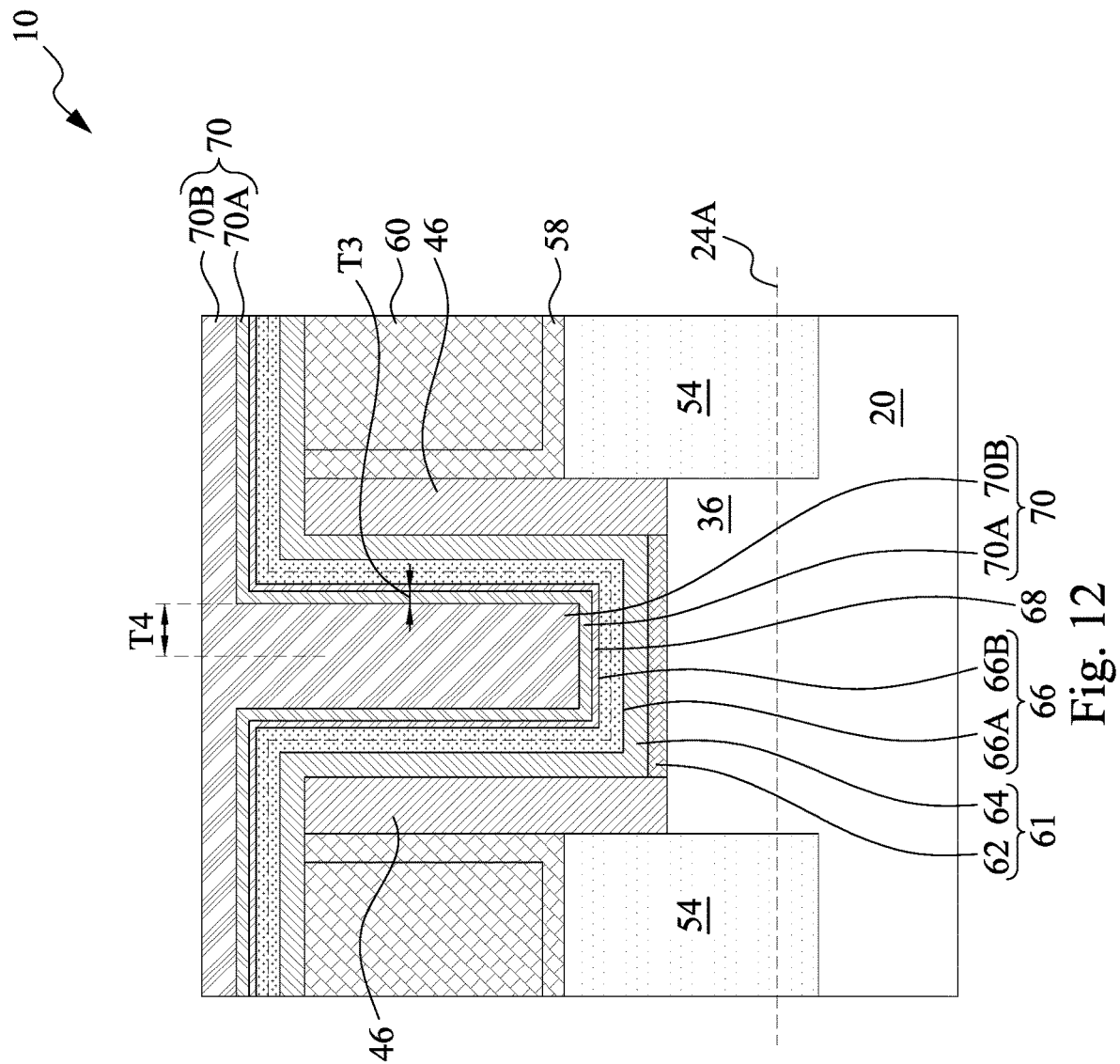

FIGS. 11 and 12 illustrate the formation of main metal layer 70, which fully fills opening 59. Main metal layer 70 may include a homogenous layer having an entirety formed of a same material, or may include a plurality of sub layers formed of materials different from each other. Main metal layer 70 may include (sub) layers 70A and 70B formed of the same materials (including same elements), and having the same composition or different compositions. In accordance with some embodiments, the formation of main metal layer 70 includes depositing lower layer 70A, followed by a deposition process to form upper layer 70B. Furthermore, main metal layer 70 may have a p-type work function higher than 4.5 eV, and the work function may be in the range between about 4.5 eV and about 5.3 eV. The material of main metal layer 70 is also a low-resistance conductive material (which may be a metal). In accordance with some embodiments, main metal layer 70 is formed of or comprises tungsten, aluminum, cobalt, or alloys thereof. In an example process in which tungsten is used, the process gas may include $WF_6$ and $H_2$, and some carrier gases such as argon may be used. In accordance with some embodiments, the distance S1 of main metal layer 70 from high-k dielectric layer 64 is small enough (for example, smaller than about 80 Å, so that a lower portion of main metal layer 70 may act as a part of the work-function layer of the FinFET. In accordance with alternative embodiments, distance S1 is greater than about 80 Å, so that main metal layer 70 no longer has the function of the work-function layer.

Figure 15:
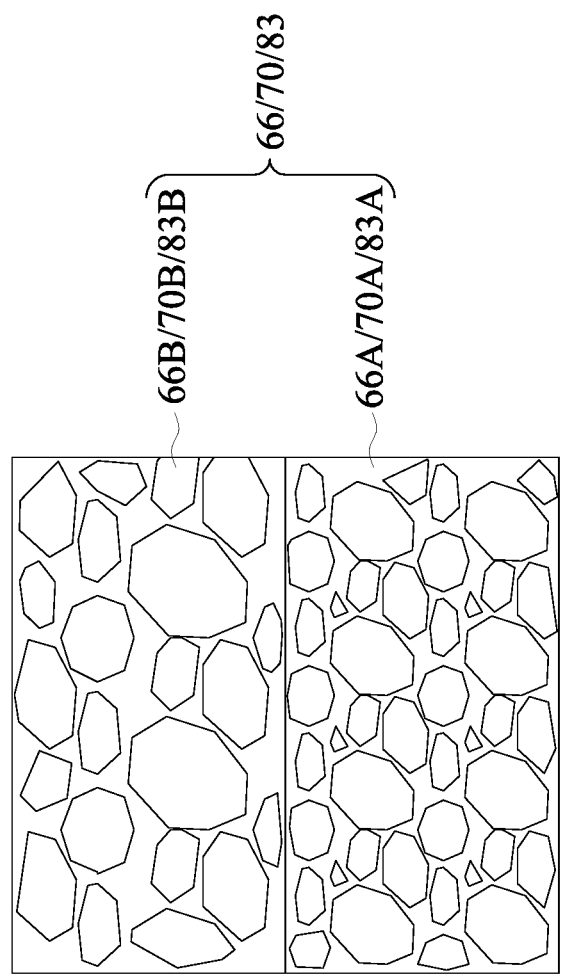
FIG. 15 illustrates the crystal sizes of a metal layer in a gate electrode of a FinFET in accordance with some embodiments.

Referring to FIG. 11, lower (sub) layer 70A is deposited. The respective process is illustrated as process 224 in the process flow 200 shown in FIG. 22. Referring to FIG. 12, upper layer 70B is deposited. The respective process is illustrated as process 226 in the process flow 200 shown in FIG. 22. Lower layer 70A and upper layer 70B may be deposited through a deposition method such as ALD, CVD, Plasma Enhanced CVD (PECVD), or the like. In accordance with some embodiments, both of lower layer 70A and upper layer 70B have polycrystalline structures. In accordance with some embodiments, lower layer 70A has grain sizes smaller than the grain sizes of upper layer 70B. The respective grain sizes are schematically illustrated in FIG. 15. In accordance with some embodiments, the average grain size of lower layer 70A is smaller than about 5 nm, and the average grain size of upper layer 70B is in the range between about 3 nm and about 500 nm. The ratio of the average grain size of upper layer 70B to the average grain size of lower layer 70A is greater than 0.5, or may be greater than about 100, and may be in the range between about 0.5 and about 500. Forming upper layers with larger grain sizes may reduce the sheet resistance of the respective FinFET. Alternatively, the grain size of lower layer 70A may be equal to or greater than the grain size of upper layer 66B of the work-function layer 66.

The different grain sizes of lower layer 70A and an upper layer 70B may be achieved through adjusting the deposition process conditions such as the temperature of wafer 10, the flow rates of the processes and the pressure of the deposition chamber, the deposition rate, etc. For example, the lower layer 70A may be deposited at a higher temperature Temp3 in a range between about 300° C. and about 500° C., and the upper layer 70B may be deposited at a lower temperature Temp4 in a range between about 250° C. and about 450° C. The difference between the higher temperature Temp3 and the lower temperature Temp4 may be greater than about 50° C., and may be in the range between about 250° C. and about 500° C.

In accordance with some embodiments, lower layer 70A has gradient grain sizes, with upper portions of the lower layer 70A having increasingly greater grain sizes than the respective lower portions of the lower layer 70A. The gradient grain sizes may be achieved by gradually (in stages or continuously) adjusting the process conditions in the formation of lower layer 70A, for example, gradually reducing wafer temperature and/or gradually increase deposition rates, etc. Upper layer 70B, on the other hand, has a uniform grain size (with no distinguishable change in different sub layers of the upper layer 70B).

By forming main metal layer 70 with two layers formed of the same material (with the same composition or different compositions), the lower layer 70A, with the smaller grain size, is suitable for acting as a seed layer for the upper layer 70B. The lower layer 70A, with the smaller grain size, however, has a relative high sheet resistance, which adversely affects the speed of the resulting transistor. Accordingly, the upper layer 70B is formed with larger grain and hence a lower resistivity, which may be, for example, in the range between about 10 nΩ·m and about 70 nΩ·m. In accordance with some embodiments, the resistivity of the upper layer 70B to the resistivity of the lower layer 70A is smaller than 1.0, and may be in the range between about 0.2 and about 0.9.

In accordance with some embodiments, upper layer 70B is thicker than lower layer 70A. For example, the ratio of thickness T4 of upper layer 70B to the thickness T3 of lower layer 70A may be greater than 2, greater than 3, or the like. In accordance with other embodiments, thickness T4 may be equal to or smaller than thickness T3.

Figure 13:
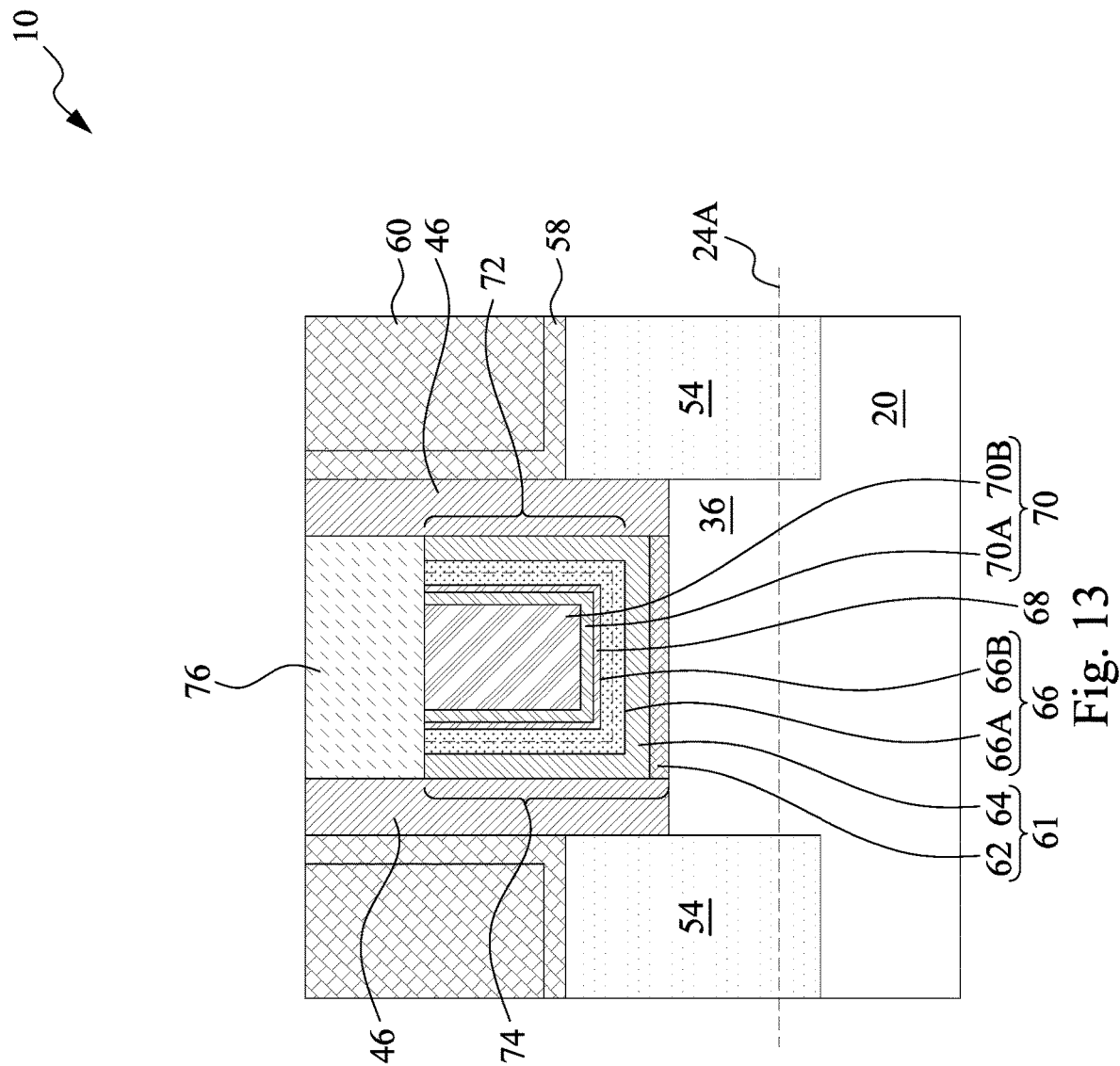

After the formation of main metal layer 70, a planarization process such a Chemical Mechanical Polish (CMP) process or a mechanical polish process is performed to remove excess portions of the deposited layers. The respective process is illustrated as process 228 in the process flow 200 shown in FIG. 22. As shown in FIG. 13, the remaining portions of the layers over high-k dielectric layer form gate stack 74, which includes gate dielectric 61 and replacement gate electrode 72. Replacement gate electrode 72 may further include work-function layer 66, glue layer 68, and main metal layer 70.

In accordance with alternative embodiments, instead of having both of work-function layer 66 and main metal layer 70 having sub layers formed of same materials but different grain sizes, work-function layer 66 is free from the sub layers, while main metal layer 70 has the sub layers formed of the same material but different grain sizes.

In accordance with yet alternative embodiments, the formation of work-function layer 66 and glue layer 68 is skipped. Instead, main metal layer 70 is formed directly on, and in physical contact with, high-k dielectric layer 64. Main metal layer 70 thus acts as both of the work-function layer and the overlying filling metal. In accordance with these embodiments, main metal layer 70 includes two sub layers formed of the same material (with the same composition or different compositions), and have different grains. The details of the materials and the formation processes of the corresponding main metal layer 70 in accordance with these embodiments may be found referring to the discussion referring to FIGS. 11 and 12.

Subsequently, an etch-back process is performed to recess gate stack 74, so that a trench is formed between opposing gate spacers 46. Next, the trench is filled with a dielectric material to form dielectric region 76, as also shown in FIG. 13. The respective process is illustrated as process 230 in the process flow 200 shown in FIG. 22. Dielectric region 76 is formed of a dielectric material such as silicon nitride, porous silicon oxy-nitride, silicon oxy-carbide, or the like. Dielectric region 76 is also planarized so that its top surface is coplanar with the top surface of ILD 60.

Figure 14A:
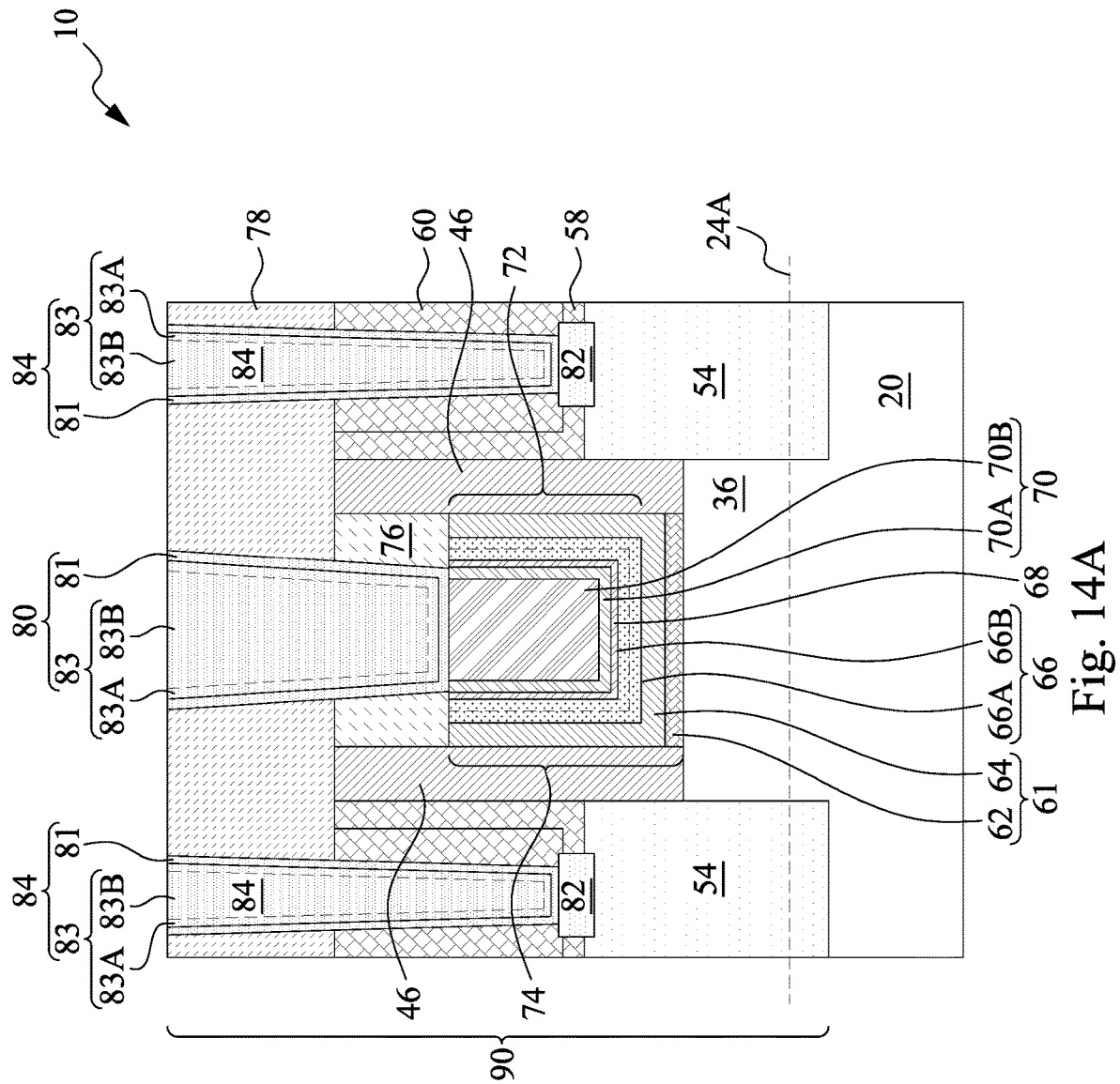

FIG. 14A illustrates the formation of ILD 78, gate contact plug 80, source/drain silicide region 82, and source/drain contact plugs 84. The respective process is illustrated as process 232 in the process flow 200 shown in FIG. 22. ILD 78 may be formed of a dielectric material selected from the same group of candidate materials for forming ILD 60. The formation of source/drain contact plugs 84 includes forming contact openings by etching ILD 78 and ILD 60 to expose the underlying portions of CESL 58, and then etching the exposed portions of CESL 58 to reveal source/drain regions 54. In a subsequent process, a metal layer (such as a Ti layer) is deposited to extend into the contact openings. A metal nitride layer (such as a TiN layer) 81 may be deposited. An anneal process is then performed to react the metal layer with the top portion of source/drain regions 54 to form silicide regions 82. A filling metallic material 83 such as copper, tungsten, aluminum, cobalt, or the like, is then filled into the contact openings, followed by a planarization to remove excess materials, resulting in source/drain contact plugs 84. The formation of gate contact plug 80 may include etching ILD 78 and dielectric region 76 to expose gate electrode 72, and forming gate contact plug 80 in the corresponding openings. Gate contact plug 80 may also include a diffusion barrier layer 81 (such as titanium nitride) and a metal region 83 (such as copper, tungsten, aluminum, cobalt, or the like) over the diffusion barrier layer. Gate contact plug 80 and source/drain contact plugs 84 may be formed sharing some deposition processes (such as the deposition of metal region 83) and the planarization process. FinFET 90 is thus formed.

Figure 14B:
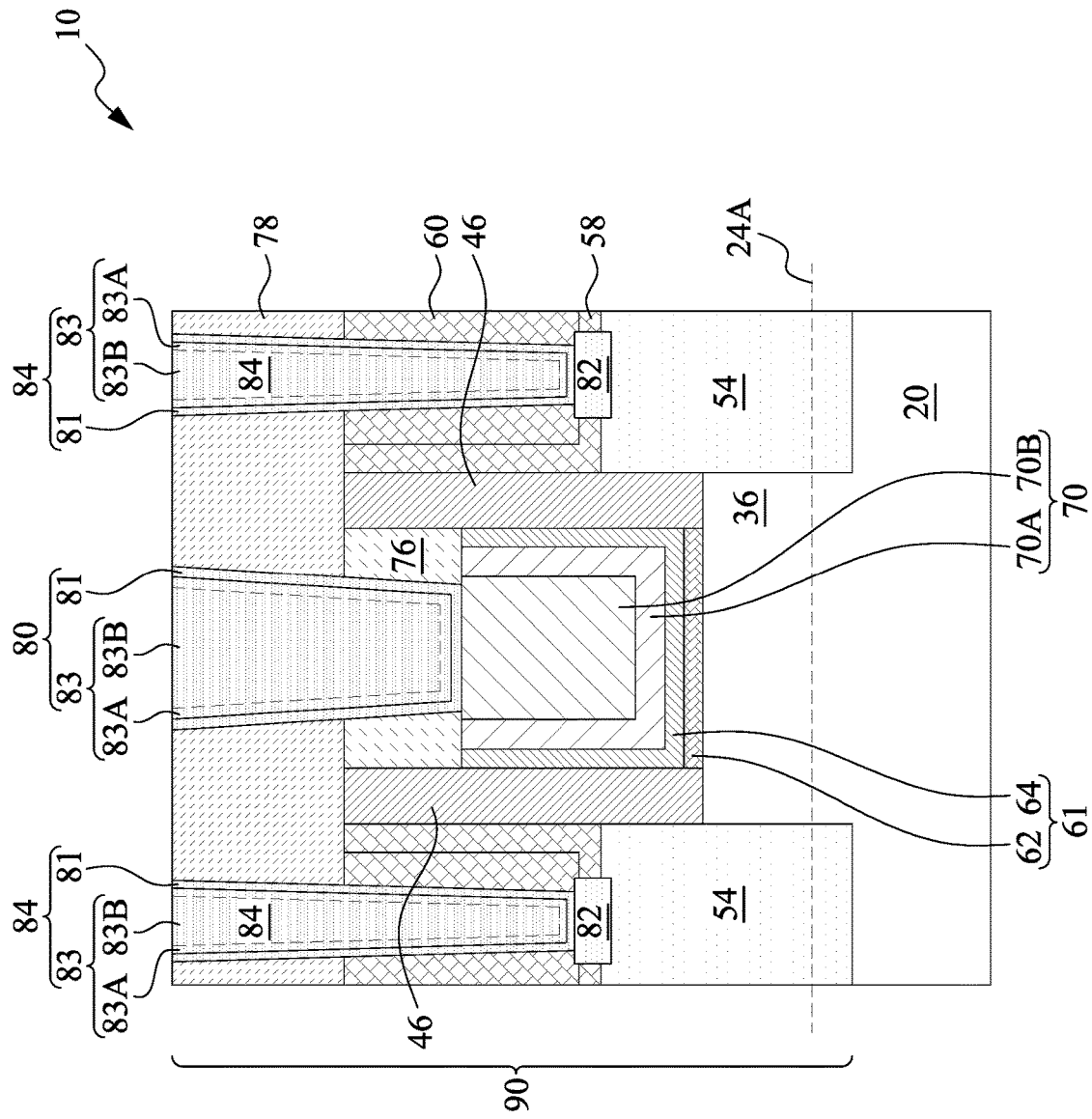

FIG. 14B illustrates FinFET 90 in accordance with alternative embodiments. These embodiments are similar to the embodiments as shown in FIG. 14A, except that the work-function layer 66 and glue layer 68 as shown in FIG. 14A are not formed. Rather, main metal layer 70, which includes sub layers 70A and 70B, is in physical contact with high-k dielectric layer 64. Main metal layer 70 has the p-type work function, and hence a lower portion of main metal layer 70 acts as the work-function layer.

In accordance with some embodiments, the metal regions 83 in source/drain contact plugs 84 and gate contact plug 80 also include two sub layers formed of the same material (having same elements), and with the same composition or different compositions. Also, the lower sub layer 83A may have a smaller average grain size than the upper layer 83B. The respective grain sizes are schematically illustrated in FIG. 15. The formation process may be similar to that of main metal layer 70. Also, the ranges of the grain sizes and the relative thicknesses of sub layers 83A and 84B may also be similar to that of sub layers 70A and 70B, respectively.

Figure 16:
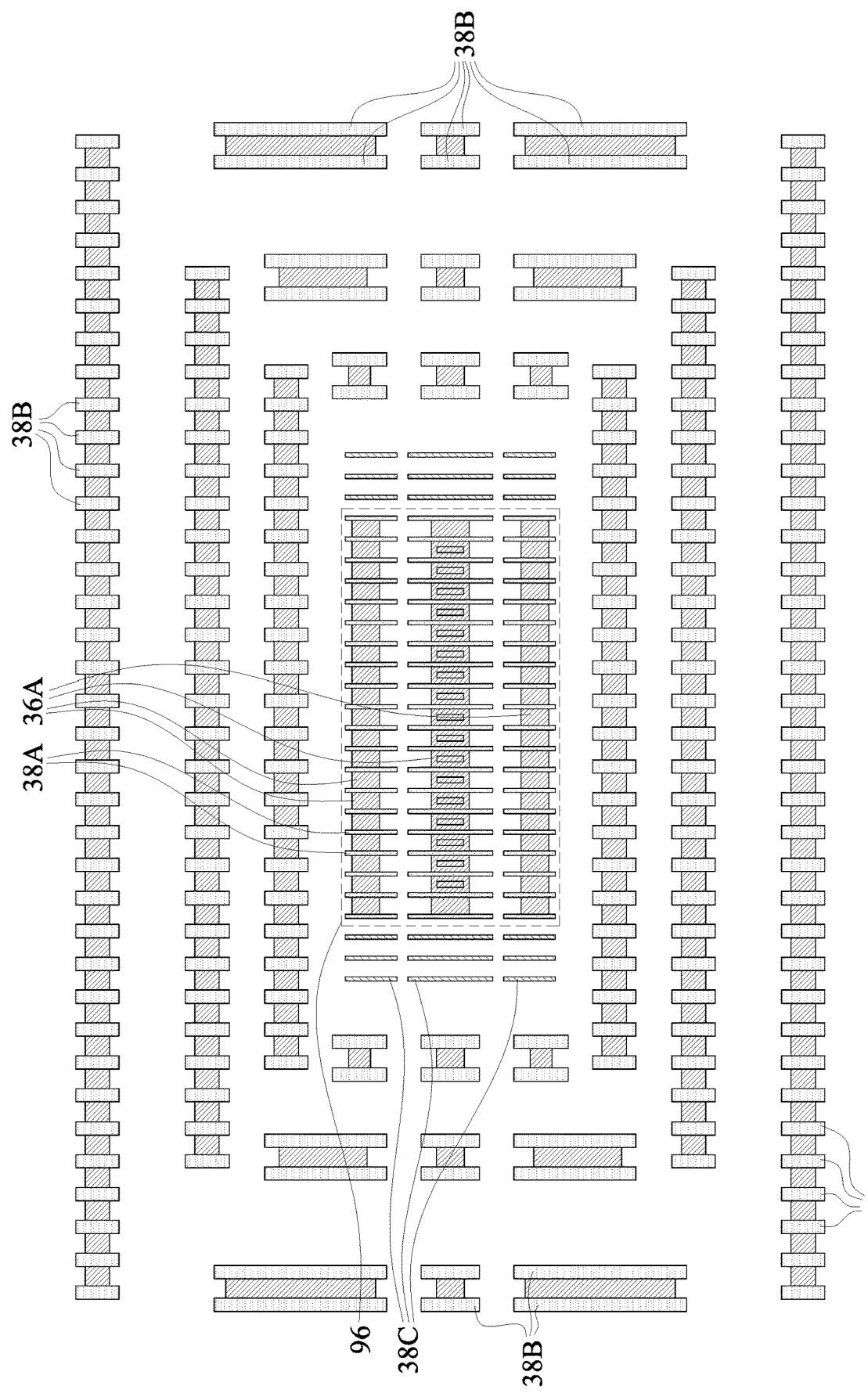
FIG. 16 illustrates the layout of the fins and gate stacks of a p-type RF device in accordance with some embodiments.

In accordance with some embodiments, the FinFET 90 as shown in FIGS. 14A and 14B may be used to form an RF device used in an RF circuit. RF device works at high frequency such as in the range between about 100 kHz and about 300 GHz, or between about 1 GHz and about 300 GHz. Conventionally, n-type transistors are used as RF devices, while p-type transistors cannot be used as RF devices since their speed is not fast enough. In accordance with some embodiments, by reducing the sheet resistance of the gate electrode and the contact plugs, p-type FinFET 90 may be used as an RF device. FIG. 16 illustrates a layout of protruding fins 36 (including 36A and 36B) and dummy gate stacks 38 (including 38A, 38B, and 38C), which are used for forming an RF device. In the center region 96 of the layout are protruding fins 36A and dummy gate stacks 38A. The layout in FIG. 16 may correspond to the structure shown in FIG. 4. There are some narrow dummy gate stacks 38C formed.

Figure 17:
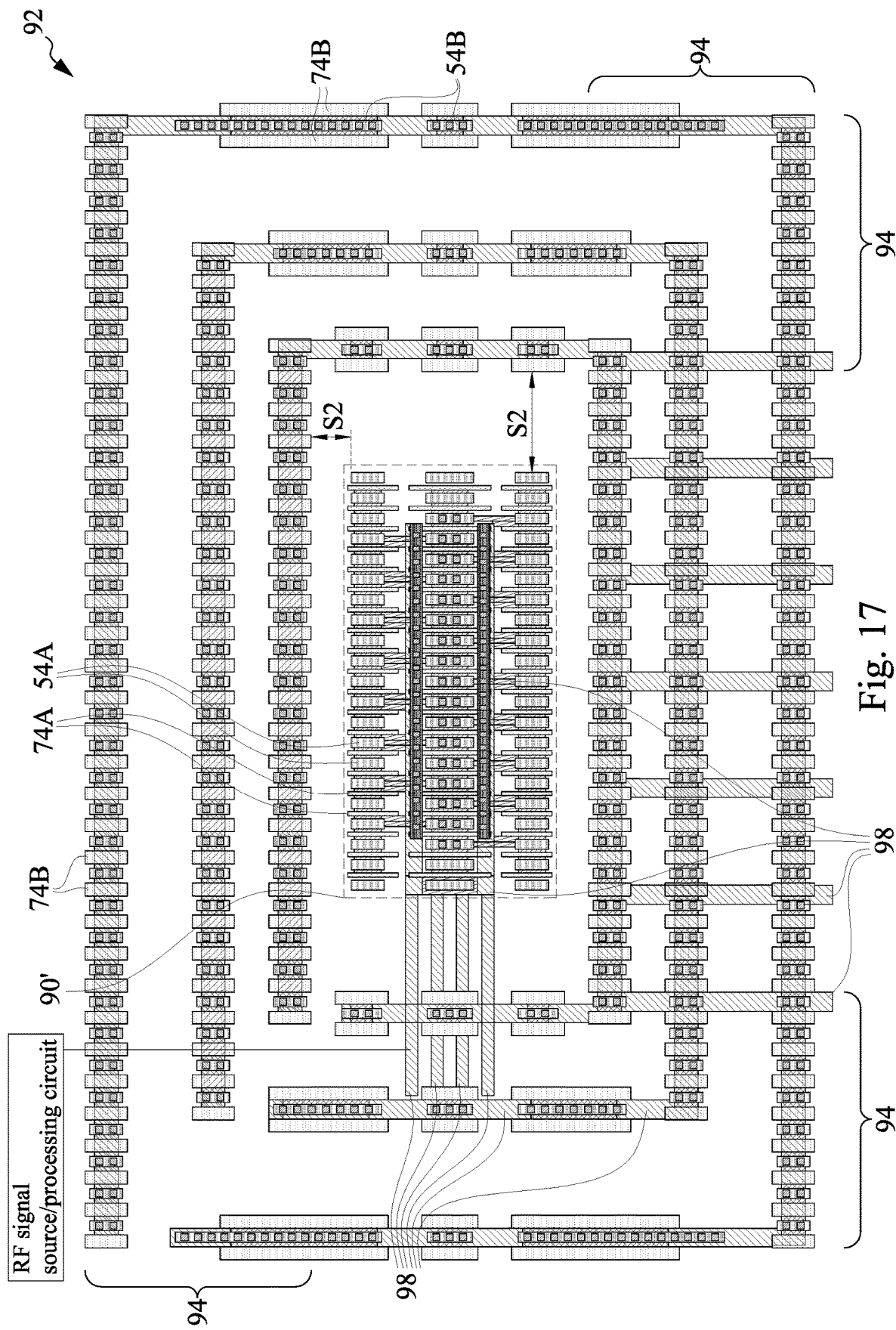
FIG. 17 illustrates the layout of the fins, gate stacks, contact vias and metal connections of a p-type RF device in accordance with some embodiments.

By performing the processes as shown in FIGS. 5, 6, 7A, 7B, 8A, 8B, 9-13, 14A, and 14B, an example RF device 92, which includes p-type FinFET 90 and guard rings 94 encircling p-type FinFET 90, may be formed as shown in FIG. 17. The dummy gate stacks 38 in FIG. 16 have been replaced with replacement gate stacks 74A and 74B, and the exposed protruding fins 36 in FIG. 16 have been replaced with source/drain regions 54 (including 54A and 54B) in FIG. 17. Gate stacks 74A and 74B may be formed sharing common formation processes and have the same structures, or may formed in different processes and/or have different structures. Source/drain regions 54A and 54B may also be formed sharing common formation processes and have the same structures, or may formed in different processes and/or have different structures. Replacement gate stacks 74A and source/drain regions 54 form a plurality of p-type FinFETs arranged in a plurality of rows (3 rows as an example). Each of the p-type FinFETs may have a similar structure as shown in FIG. 14A or 14B. The plurality of p-type FinFETs in the same rows share common source regions and common drain regions (refer to epitaxy regions 54 in FIGS. 14A and 14B). The plurality of p-type FinFETs are connected in parallel to form a large p-type FinFET 90'. P-type FinFET 90' may be electrically coupled to an RF signal source and/or an RF signal process unit. The RF signal source may include, and is not limited to, an RF antenna, an oscillator, or the like.

Dummy source/drain regions 54B and dummy replacement gate stacks 74B form guard rings 94. In the example as shown in FIG. 17, three guard rings 94 are formed. The metal lines 98, which are used for interconnection purpose, are also illustrated. In accordance with some embodiments, the dummy source/drain regions 54B and dummy replacement gate stacks 74B in the guard rings are all electrically grounded through metal lines 98.

In accordance with some embodiments, the distances S2 between p-type FinFET 90' and the nearest guard ring 94 are greater than about 3.2 Since the guard rings 94 and the p-type FinFET 90' have different structures and may be formed using different processes, this distance ensures that enough space is left for forming masks protecting one of the FinFET region and the guard ring region, so that p-type FinFET 90' and guard ring 94 may have different processes formed thereon.

Figure 19:
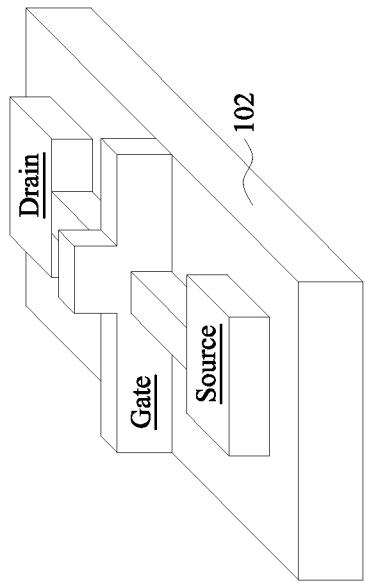
FIGS. 18 through 21 illustrate some p-type transistor that can be used as RF devices in accordance with some embodiments.
Figure 18:
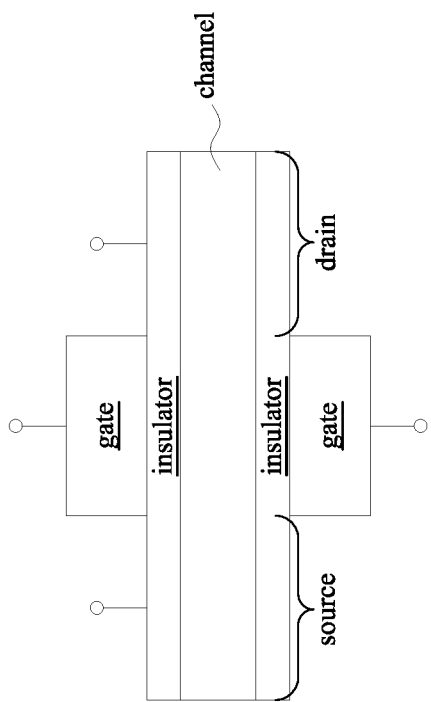
Figure 21:
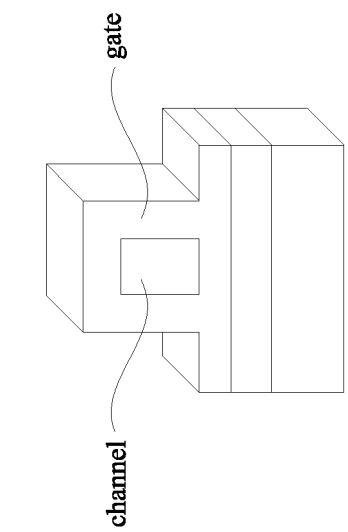
Figure 20:
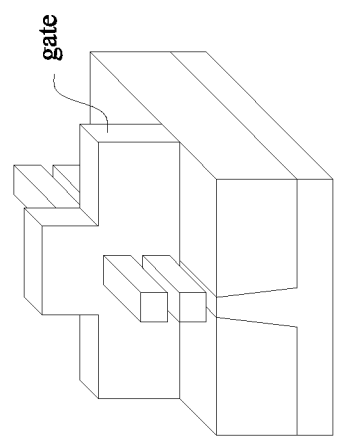

FIGS. 18 through 21 illustrate some example p-type transistors in which the embodiments of the present disclosure may be applied, so that these transistors may be used as RF devices. FIG. 18 illustrates a top view of a double-gate transistor, wherein two gates are formed on opposing side of the channel. FIG. 19 illustrates a perspective view of a FinFET formed on isolation region 102. FIG. 20 illustrates the perspective view of a GAA transistor including two channel layers. FIG. 21 illustrates a GAA transistor include one channel layer. The gate stacks of these transistors may be formed adopting the embodiments of the present disclosure to improve the operation speed.

The embodiments of the present disclosure have some advantageous features. By forming gate electrodes including sub layers formed of the same material but have different grain sizes, the sheet resistance values of the gate electrodes may be reduced, and hence the respective p-type transistors have high speed, and can be used as p-type RF devices (switches).

In accordance with some embodiments of the present disclosure, a method comprises forming a dummy gate stack over a semiconductor region; removing the dummy gate stack to form a trench between gate spacers; forming a replacement gate dielectric extending into the trench; forming a replacement gate electrode on the replacement gate dielectric, wherein the forming the replacement gate electrode comprises depositing a metal-containing layer, and wherein the depositing the metal-containing layer comprises depositing a lower layer having a first average grain size; and depositing an upper layer over the lower layer, wherein the lower layer and the upper layer are formed of a same material, and the upper layer has a second average grain size greater than the first average grain size; and forming source and drain regions on opposing sides of the replacement gate electrode. In an embodiment, the lower layer and the upper layer have a same composition. In an embodiment, the depositing the lower layer is performed at a first temperature, and the depositing the upper layer is performed at a second temperature lower than the first temperature. In an embodiment, lower layer is deposited at a first deposition rate, and the upper layer is deposited at a second deposition rate higher than the first deposition rate. In an embodiment, the depositing the lower layer and the depositing the upper layer are performed using same process gases, and ratios of flow rates of the same process gases in the forming the lower layer are same as corresponding ratios of flow rates of the same process gases in the forming the upper layer. In an embodiment, the depositing the metal-containing layer comprises depositing a work-function layer. In an embodiment, the forming the replacement gate electrode comprises: depositing a work-function layer over the replacement gate dielectric, wherein the metal-containing layer is deposited over the work-function layer. In an embodiment, the depositing the metal-containing layer comprises depositing a metal selected from tungsten, aluminum, cobalt, and alloys thereof. In an embodiment, the method further comprises forming a contact plug over and contacting the replacement gate electrode, wherein the forming the contact plug comprises: depositing an additional lower layer having a third average grain size; and depositing an additional upper layer over the additional lower layer, wherein the additional lower layer and the additional upper layer are formed of an additional same material, and the additional upper layer has a fourth average grain size greater than the third average grain size.

In accordance with some embodiments of the present disclosure, a device comprises a semiconductor region; a gate dielectric over and contacting the semiconductor region; a gate electrode over the gate dielectric, wherein the gate electrode comprises a metal-containing layer, and the metal-containing layer comprises a lower layer having a first average grain size; and an upper layer over the lower layer, wherein the lower layer and the upper layer are formed of a same material, and the upper layer has a second average grain size greater than the first average grain size; and source and drain regions on opposing sides of the gate electrode. In an embodiment, the metal-containing layer is a work-function layer. In an embodiment, the device further comprises a glue layer over and contacting the work-function layer; and a metal-filling region over the glue layer. In an embodiment, the gate electrode comprises a work-function layer over the gate dielectric; and a glue layer over and contacting the work-function layer, wherein the metal-containing layer is over the glue layer. In an embodiment, the metal-containing layer comprises a metal selected from the group consisting of tungsten, aluminum, cobalt, and combinations thereof. In an embodiment, the gate dielectric, the gate electrode, and the source and drain regions form parts of a p-type transistor, and the metal-containing layer has a work-function higher than about 4.5 eV.

In accordance with some embodiments of the present disclosure, a device comprises a semiconductor fin; a gate dielectric on sidewalls and a top surface of the semiconductor fin; a work-function layer over and contacting the gate dielectric, wherein the work-function layer has a U-shaped cross-sectional view shape, and wherein the work-function layer comprises a first bottom portion and first sidewall portions over and connecting to opposing ends of the first bottom portion; a glue layer over the first bottom portion of the work-function layer, wherein the glue layer comprises a second bottom portion and second sidewall portions over and connecting to the second bottom portion; and a metal layer over the second bottom portion of the work-function layer, wherein the metal layer comprises a first sub layer having a first average grain size; and a second sub layer having a second average grain size different from the first average grain size, wherein the first sub layer and the second sub layer are formed of a same metallic material. In an embodiment, the second sub layer is over the first sub layer, and the second average grain size is greater than the first average grain size. In an embodiment, the second sub layer is thicker than the first sub layer. In an embodiment, both of the first sub layer and the second sub layer comprise tungsten. In an embodiment, both of the first sub layer and the second sub layer comprises cobalt.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor region;
a gate dielectric over and contacting the semiconductor region;
a gate electrode over the gate dielectric, wherein the gate electrode comprises:
a metal-containing layer, wherein the metal-containing layer is a work-function layer, and the metal-containing layer comprises:
a lower layer having a first average grain size; and
an upper layer over the lower layer, wherein the lower layer and the upper layer comprise a same material, and the upper layer has a second average grain size greater than the first average grain size;
a glue layer over and contacting the work-function layer; and
a metal-filling region over the glue layer; and
source and drain regions on opposing sides of the gate electrode.

2. The device of claim 1, wherein the metal-containing layer comprises a metal selected from the group consisting of tungsten, aluminum, cobalt, and combinations thereof.

3. The device of claim 1, wherein the gate dielectric, the gate electrode, and the source and drain regions form parts of a p-type transistor, and the metal-containing layer has a work-function higher than about 4.5 eV.

4. The device of claim 1 further comprising a gate contact plug over and contacting the upper layer of the gate electrode.

5. The device of claim 4, wherein the gate contact plug further comprises a lower sub layer and an upper sub layer having different grain sizes.

6. The device of claim 5, wherein the upper sub layer has a greater grain size than the lower sub layer.

7. The device of claim 1, wherein the lower layer and the upper layer comprise a same metal.

8. The device of claim 1, wherein a ratio of the second average grain size to the first average grain size is greater than about 100.

9. A device comprising:
a semiconductor fin;
a gate dielectric on sidewalls and a top surface of the semiconductor fin;
a work-function layer over and contacting the gate dielectric, wherein the work-function layer has a U-shaped cross-sectional view shape, and wherein the work-function layer comprises a first bottom portion and first sidewall portions over and connecting to opposing ends of the first bottom portion, and wherein the work-function layer comprises:
a lower layer having a first average grain size; and
an upper layer over the lower layer, wherein the lower layer and the upper layer comprise a same material, and the upper layer has a second average grain size greater than the first average grain size;
a glue layer over the first bottom portion of the work-function layer, wherein the glue layer comprises a second bottom portion and second sidewall portions over and connecting to the second bottom portion; and
a metal layer having a polycrystalline structure over the second bottom portion of the glue layer.

10. The device of claim 9, wherein a ratio of the second average grain size to the first average grain size is greater than about 100.

11. The device of claim 9 further comprising a gate contact plug over and contacting the metal layer, wherein the gate contact plug comprises a lower portion and an upper portion over the lower portion, and the upper portion has a different average grain size than the lower portion.

12. The device of claim 11, wherein the upper portion of the gate contact plug has a greater average grain size than the lower portion of the gate contact plug.

13. The device of claim 9, wherein the metal layer comprises:
a first sub layer having a third average grain size; and
a second sub layer having a fourth average grain size different from the third average grain size.

14. The device of claim 13, wherein the second sub layer is over the first sub layer, and the second average grain size is greater than the first average grain size.

15. The device of claim 13, wherein the second sub layer is thicker than the first sub layer.

16. A device comprising:
a semiconductor fin;
a gate dielectric on sidewalls and a top surface of the semiconductor fin;
a work-function layer over and contacting the gate dielectric, wherein the work-function layer has a polycrystalline structure, and the work-function layer comprises:
a first sub layer of the work-function layer; and
a second sub layer over the first sub layer, wherein the first sub layer and the second sub layer comprise same first elements, and the second sub layer has a different average grain size than the first sub layer; and
a metal layer over the work-function layer, wherein the metal layer comprises:
a third sub layer; and
a fourth sub layer, wherein the third sub layer and the fourth sub layer comprise same second elements, and wherein the fourth sub layer has a different average grain size than the third sub layer.

17. The device of claim 16, wherein the gate dielectric, the work-function layer, and the metal layer are comprised in a transistor, and the device further comprises:
a guard ring encircling the transistor, wherein the guard ring comprises a plurality of dummy gate stacks, and wherein each of the dummy gate stacks comprises a stacked metal layer, with an upper part of the stacked metal layer having an average grain size greater than an average grain size of a corresponding lower part of the stacked metal layer.

18. The device of claim 17, wherein the transistor is a p-type transistor.

19. The device of claim 16, wherein the work-function layer comprises titanium nitride.

20. The device of claim 16, wherein the metal layer comprises tungsten.

* * * * *